(12) United States Patent
Kim et al.

(10) Patent No.: US 11,605,803 B2
(45) Date of Patent: *Mar. 14, 2023

(54) STRETCHABLE DISPLAY DEVICE

(71) Applicant: LG Display Co., Ltd., Seoul (KR)

(72) Inventors: Kihan Kim, Paju-si (KR); Hyokang Lee, Paju-si (KR); Hohyun Keum, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 70 days.

This patent is subject to a terminal disclaimer.

(21) Appl. No.: 17/232,897

(22) Filed: Apr. 16, 2021

(65) Prior Publication Data

US 2021/0234135 A1 Jul. 29, 2021

Related U.S. Application Data

(63) Continuation of application No. 16/593,860, filed on Oct. 4, 2019, now Pat. No. 11,018,324.

(30) Foreign Application Priority Data

Oct. 8, 2018 (KR) .................. 10-2018-0119790

(51) Int. Cl.
*H01L 51/52* (2006.01)
*H01L 51/00* (2006.01)
*H01L 27/32* (2006.01)

(52) U.S. Cl.
CPC ...... *H01L 51/5284* (2013.01); *H01L 51/0097* (2013.01); *H01L 51/5281* (2013.01); *H01L 27/3244* (2013.01); *H01L 2251/5338* (2013.01)

(58) Field of Classification Search
CPC .......... G02F 1/133528; H01L 27/3232; H01L 51/5284; H01L 51/0097
See application file for complete search history.

(56) References Cited

U.S. PATENT DOCUMENTS

| 11,018,324 B2* | 5/2021 | Kim .................. H01L 27/3276 |
| 2013/0168644 A1 | 7/2013 | Park |
| 2015/0131033 A1 | 5/2015 | Min |
| 2017/0005077 A1 | 1/2017 | Kim et al. |
| 2018/0046221 A1 | 2/2018 | Choi et al. |

FOREIGN PATENT DOCUMENTS

KR 10-2016-0101825 A 8/2016

* cited by examiner

*Primary Examiner* — Changhyun Yi
(74) *Attorney, Agent, or Firm* — Polsinelli PC

(57) ABSTRACT

A stretchable display device comprises a lower substrate, a plurality of island substrates disposed on the lower substrate and spaced apart from each other, a plurality of display elements disposed on the plurality of island substrates, a plurality of connecting lines disposed between each of the plurality of island substrates, an upper substrate disposed on the lower substrate, the plurality of display elements and the plurality of connecting lines, and a polarizing layer disposed on the upper substrate and including a phase delay layer on the upper substrate and a linear polarizing plate on the phase delay layer, wherein the phase delay layer includes a first base polymer, wherein the linear polarizing plate includes a second base polymer, and wherein the first and second base polymers include a same material as the upper substrate.

12 Claims, 16 Drawing Sheets

STRETCHABLE DISPLAY DEVICE

CROSS-REFERENCE TO RELATED APPLICATION

This application is a continuation of U.S. patent application Ser. No. 16/593,860, filed on Oct. 4, 2019, which claims the benefit of the priority of Korean Patent Application No. 10-2018-0119790, filed on Oct. 8, 2018, all of which are hereby incorporated by reference in their entireties.

BACKGROUND

Field of the Disclosure

The present disclosure relates to a display device, and more particularly, to a stretchable display device. Although the present disclosure is suitable for a wide scope of applications, it is particularly suitable for providing the stretchable display device with bending or stretching characteristic by using a stretchable polarizing plate.

Description of the Background

An organic light emitting display (OLED) that emits light by itself and a liquid crystal display (LCD) that requires a separate light source are currently used as display devices in everyday life. Display devices have been applied to various fields including not only a computer monitor and a TV, but personal mobile devices. As a result, a display device with a wide active area and a reduced volume and weight is being studied.

Recently, a stretchable display device manufactured to be able to stretch/contract in a specific direction and change into various shapes by forming a display unit, lines, etc. on a flexible substrate such as plastic that is a flexible material has been spotlighted as a next generation display device.

SUMMARY

The present disclosure provides a stretchable display device in which damage to a polarizing layer is minimized when a stretchable display device is stretched, by disposing a polarizing layer that is easily stretched.

Also, the present disclosure provides a stretchable display device that reduces visibility of external light being reflected to a user by using a polarizing plate having a stretchable characteristic.

In addition, the present disclosure provides a stretchable display device in which a polarizing layer can be firmly bonded and of which the thickness of the stretchable display can be reduced because components disposed under an upper substrate and a polarizing layer are configured to include the same material as the polarizing layer.

Further, the present disclosure provides a stretchable display device that can be easily stretched in a plurality of directions by alternately disposing stretchable polarizing layers in different directions.

Aspects of the present disclosure are not limited to the above-mentioned, and other aspects, which are not mentioned above, can be clearly understood by those skilled in the art from the following descriptions.

In order to provide the aspects described above, a stretchable display device comprises a plurality of island substrates in which a plurality of pixels is defined and spaced apart from each other; a lower substrate disposed under the plurality of island substrates; a connecting line electrically connecting pads disposed at adjacent island substrates of the plurality of island substrates; and a polarizing layer disposed on the lower substrate and the plurality of island substrates, wherein the polarizing layer includes a phase delay layer having a reactive mesogen dispersed in a first base polymer, and a linear polarizing plate disposed on the phase delay layer and having a dye dispersed in a second base polymer.

In another aspect of the present disclosure, a stretchable display device comprises a lower substrate; a plurality of island substrates disposed on the lower substrate and spaced apart from each other; a plurality of display elements disposed on the plurality of island substrates; and a polarizing layer disposed on the lower substrate and the plurality of display elements and having a structure in which a phase delay layer and a linear polarizing plate are stacked, wherein the phase delay layer and the linear polarizing plate include a same material as the lower substrate.

In a further aspect of the present disclosure, a stretchable display device comprises a lower substrate and an upper substrate facing each other; a plurality of island substrates disposed on the lower substrate and spaced apart from each other; a plurality of display elements disposed on the plurality of island substrates; and a polarizing layer disposed on the upper substrate and including a phase delay layer and a linear polarizing plate located on the phase delay layer, wherein the phase delay layer includes a reactive mesogen dispersed in a first base polymer, the linear polarizing plate includes a dye dispersed in a second base polymer, and the reactive mesogen is aligned in a −45 degrees or +45 degrees direction with respect to an alignment direction of the dye.

Other detailed matters of the exemplary aspects are included in the detailed description and the drawings.

The present disclosure has an effect of reducing external reflection of a stretchable display device by aligning a reactive mesogen and a dye included in a polarizing layer in different directions.

The present disclosure has an effect of enabling a stretchable display device to easily bend or stretch in various directions by disposing polarizing layers, which stretch in different directions, on a plurality of island substrates.

The present disclosure has an effect of firmly bonding a polarizing layer and reducing the thickness of a stretchable display device by configuring the polarizing layer using the same base polymer as a lower substrate, an upper substrate, or a connecting line.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
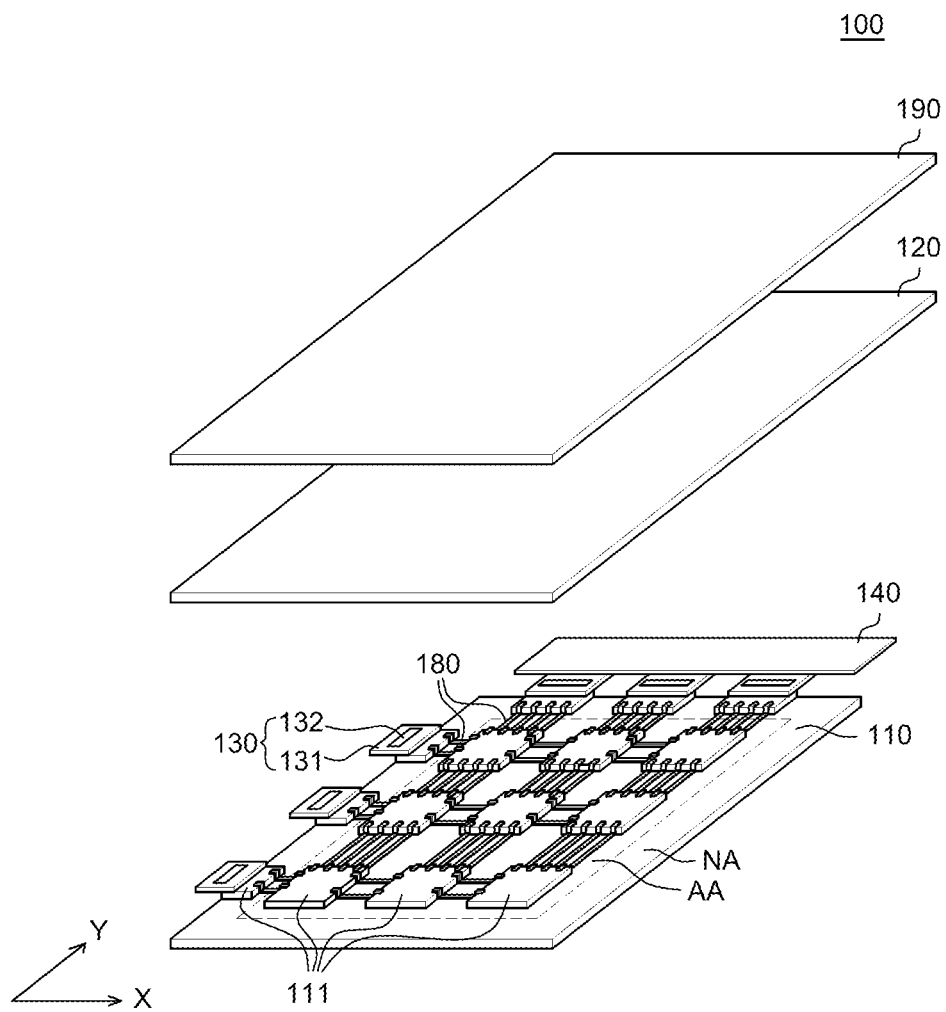
FIG. 1 is an exploded perspective view of a stretchable display device according to an aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a stretchable display device according to exemplary aspects of the present disclosure will be described in detail with reference to accompanying drawings.

A stretchable display device may be referred to as a display device that can display images even if it bends or stretches. A stretchable display device can have high flexibility, as compared with common display devices of the related art. Accordingly, the shape of the stretchable display device can be freely changed in accordance with operation by the user such as bending or stretching the stretchable display device. For example, when a user holds and pulls an end of a stretchable display device, the stretchable display device can be stretched by the force of the user. Alternatively, when a user puts a stretchable display device on an uneven wall, the stretchable display device can be disposed to be bent into the surface shape of the wall. Further, when the force applied by a user is removed, the stretchable display device can return into the initial shape.

FIG. 1 is a plan view showing a display device according to an aspect of the present disclosure. Referring to FIG. 1, a stretchable display device 100 includes a lower substrate 110, a plurality of island substrates 111, connecting lines 180, chip on films (COF) 130, a printed circuit board (PCB) 140, an upper substrate 120, and a polarizing layer 190. A lower adhesive layer for bonding the lower substrate 110 and the upper substrate 120 is not shown in FIG. 1 for the convenience of description.

The lower substrate 110 is a substrate for supporting and protecting various components of the stretchable display device 100. The lower substrate 110, which is a flexible substrate, may be made of a bendable or stretchable insulating material. For example, the lower substrate 110 may be made of silicon rubber such as polydimethylsiloxane (PDMS) or an elastomer such as polyurethane (PU), so it can have flexibility. The material of the lower substrate 110, however, is not limited thereto.

The lower substrate 110, which is a flexible substrate, may reversibly expand and contract. Further, an elastic modulus may be several to hundreds of MPa and a tensile fracture rate may be 100% or more. The thickness of the lower substrate may be 10 μm to 1 mm, but is not limited thereto.

The lower substrate 110 may have an active area AA and a non-active area NA surrounding the active area AA.

The active area AA is an area where images are displayed on the stretchable display device 100, and display elements and various driving elements for driving the display elements are disposed in the active area AA. The active area AA includes a plurality of pixels including a plurality of subpixels. The plurality of pixels is disposed in the active area AA and includes a plurality of display elements. Each of the plurality of subpixels is connected with various lines. For example, each of the plurality of subpixels is connected with various lines such as a gate line, a data line, a high-potential power line, a low-potential power line, and a reference voltage line.

The non-active area NA is an area adjacent to the active area AA. The non-active area NA is an area disposed adjacent to the active area AA and surrounding the active area AA. The non-active area NA is an area where an image is not displayed, and lines, circuit units, etc. may be disposed in the non-active area NA. For example, a plurality of pads may be disposed in the non-active area NA and each of the pads may be connected with each of the plurality of subpixels in the active area AA.

The plurality of island substrates 111 is disposed on the lower substrate 110. The plurality of island substrates 111, which has a rigid characteristic, is spaced apart from each other and disposed on the lower substrate 110. The plurality of island substrates 111 may be more rigid than the lower substrate 110, and the lower substrate 110 may be more flexible than the plurality of island substrates 111.

The plurality of island substrates 111, which is a plurality of rigid substrates, may be made of a plastic material having flexibility and, for example, may be made of polyimide (PI), polyacrylate, polyacetate, etc.

The modulus of the plurality of island substrates 111 may be higher than that of the lower substrate 110. The modulus is an elastic modulus showing a ratio of deformation of a substrate caused by stress applied to the substrate. When the modulus is relatively high, the hardness may also be relatively high. Accordingly, the plurality of island substrates 111 may be a plurality of rigid substrates that is more rigid than the lower substrate 110. The modulus of the plurality of island substrates 111 may be at least thousand times larger than that of the lower substrate 110, but are not limited thereto.

The connecting lines 180 are disposed between each of the plurality of island substrates 111. The connecting lines 180 may be disposed between the pads disposed on the plurality of island substrates 111 and may electrically connect each pad. The connecting lines 180 will be described in more detail with reference to FIG. 2.

The COFs 130, which are films having various components on flexible base films 131, are components for supplying signals to the plurality of subpixels in the active area AA. The COFs 130 may be bonded to the plurality of pads disposed in the non-active area NA and supply a power voltage, a data voltage, a gate voltage, etc. to each of the plurality of subpixels in the active area AA through the pads. Each of the COFs 130 includes a base film 131 and a driving IC 132 and may include other components.

The base films 131 are layers supporting the driving ICs 132 of the COFs 130. The base films 131 may be made of an insulating material, for example, a flexible insulating material.

The driving ICs 132 are components that process data for displaying images and driving signals for processing the data. Although the driving ICs 132 are mounted in the type of the COF 130 in FIG. 1, the driving ICs 132 are not limited thereto, and the driving ICs 132 may be mounted in the type of chip on glass (COG), tape carrier package (TCP), etc.

Controllers such as an IC chip and a circuit unit may be mounted on the printed circuit board 140. Further, a memory, a processor, etc. also may be mounted on the printed circuit board 140. The printed circuit board 140 is configured to transmit signals for driving the display elements from the controllers to the display elements.

The printed circuit board 140 is connected with the COFs 130, so they may be electrically connected with each of the plurality of subpixels on the plurality of island substrates 111.

The upper substrate 120 is a substrate overlapping the lower substrate 110 to protect various components of the stretchable display device 100. The upper substrate 120, which is a flexible substrate, may be made of a bendable or stretchable insulating material. For example, the upper substrate 120 may be made of a flexible material and may be made of the same material as the lower substrate 110, but is not limited thereto.

The polarizing layer 190 is configured to suppress external light reflection of the stretchable display device 100 and may be disposed on the upper substrate 120. However, the polarizing layer 190 is not limited thereto and, may be disposed under the upper substrate 120, or may be omitted, depending on the configuration of the stretchable display device 100.

Figure 2:
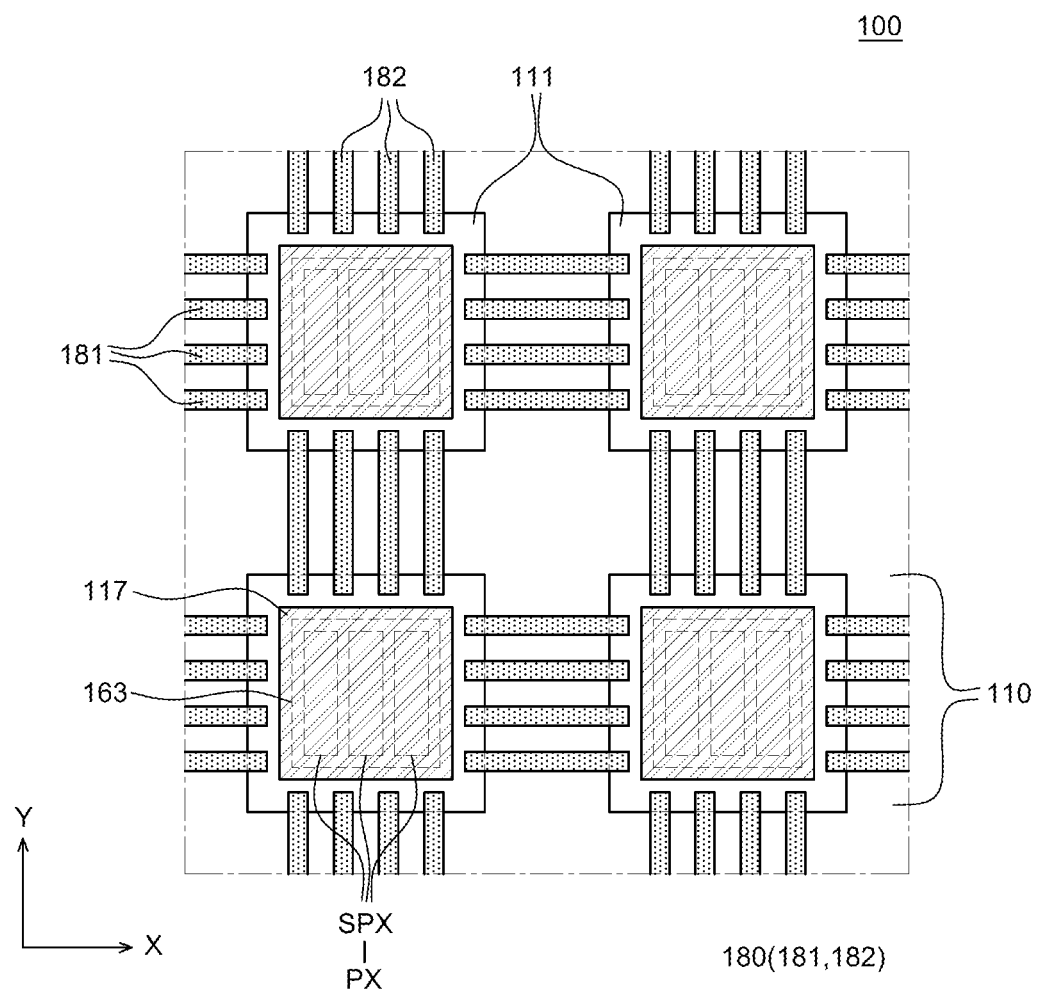
FIG. 2 is an enlarged plan view of the stretchable display device according to an aspect of the present disclosure.
Figure 3:
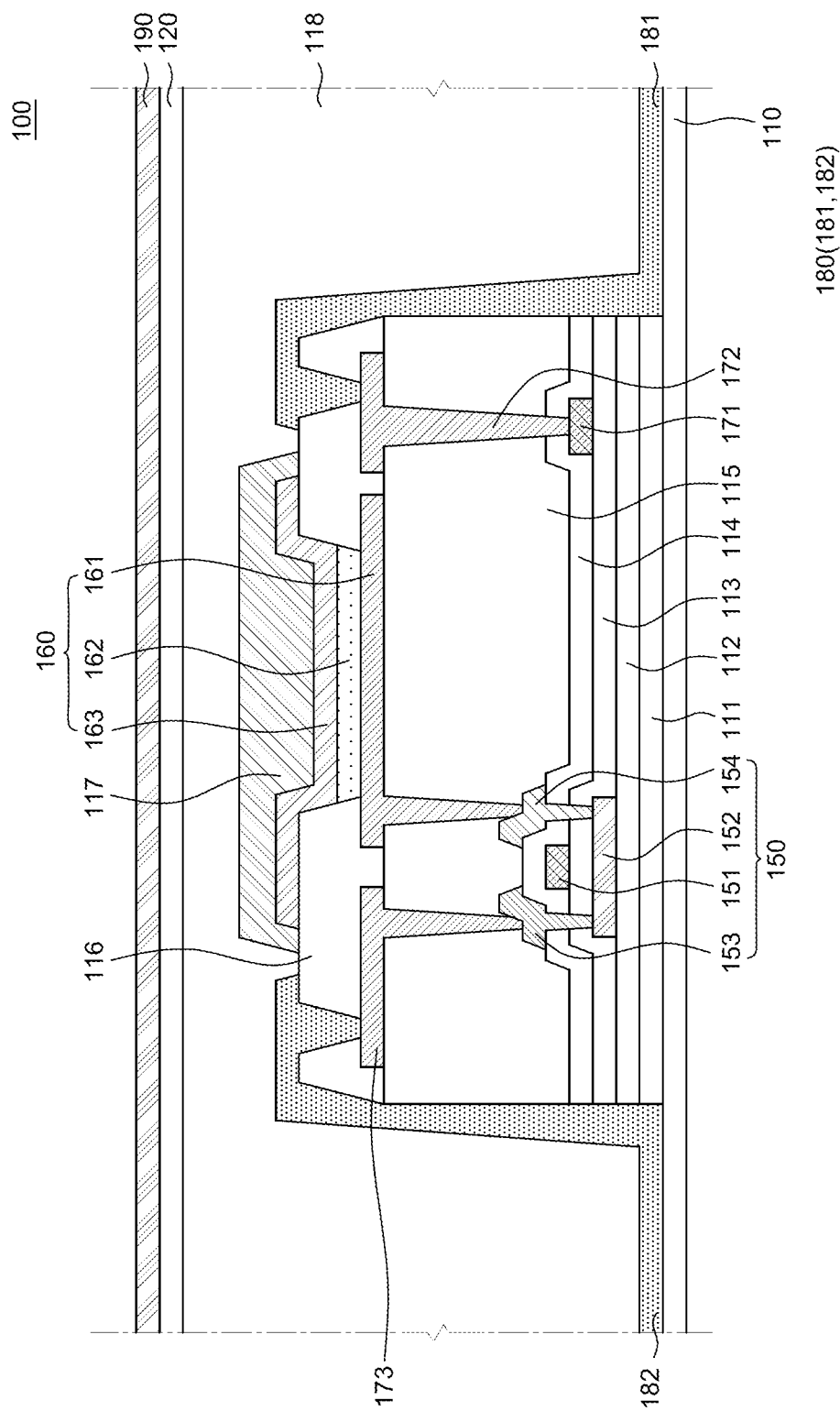
FIG. 3 is a schematic cross-sectional view of one subpixel of FIG. 1.

FIGS. 2 and 3 are referred to hereinafter to describe the stretchable display device 100 in more detail according to an aspect of the present disclosure.

FIG. 2 is an enlarged plan view of the stretchable display device according to an aspect of the present disclosure. FIG. 3 is a schematic cross-sectional view of a subpixel of FIG. 1. FIG. 1 is referred to for the convenience of description.

Referring to FIGS. 2 and 3, the plurality of island substrates 111 is disposed on the lower substrate 110. The plurality of island substrates 111 is spaced apart from each other and disposed on the lower substrate 110. For example, the plurality of island substrates 111, as shown in FIGS. 1 and 2, may be disposed in a matrix shape on the lower substrate 110, but is not limited thereto.

Referring to FIG. 3, a buffer layer 112 is disposed on the plurality of island substrates 111. The buffer layer 112 is formed on the plurality of island substrates 111 to protect various components of the stretchable display device 100 against permeation of water ($H_2O$), oxygen ($O_2$), etc. from the outside from the lower substrate 110 and the plurality of island substrates 111. The buffer layer 112 may be made of an insulating material, and for example, may be a single inorganic layer or a multi-inorganic layer made of graphite, silicon nitride, silicon oxide (SiOx), silicon oxynitride (SiON), and the like. However, the buffer layer 112 may be omitted, depending on the structure or characteristics of the stretchable display device 100.

In this regard, the buffer layer 112 may be formed only in the areas overlapping the plurality of island substrates 111. As described above, since the buffer layers 112 may be made of an inorganic material, they may be easily damaged, such as cracking, when the stretchable display device 100 is stretched. Accordingly, the buffer layer 112 is patterned in the shape of the plurality of island substrates 111 without being formed in the areas between the plurality of island substrates 111, whereby it may be formed only over the plurality of island substrates 111. Therefore, since the buffer layer 112 is formed only in the areas overlapping the plurality of island substrates 111 that is rigid substrates, it is possible to suppress damage to the buffer layer 112 even though the stretchable display device 100 according to an aspect of the present disclosure is deformed, such as, bending or stretching.

Referring to FIG. 3, a transistor 150 including a gate electrode 151, an active layer 152, a source electrode 153, and a drain electrode 154 is formed on the buffer layer 112. For example, the active layer 152 is formed on the buffer layer 112, and a gate insulating layer 113 for insulating the active layer 152 and the gate electrode 151 from each other is formed on the active layer 152. An inter-layer insulating layer 114 is formed to insulate the gate electrode 151, the source electrode 153, and the drain electrode 154, and the source electrode 153 and the drain electrode 154 that are in contact with the active layer 152, respectively, are formed on the inter-layer insulating layer 114.

The gate insulating layer 113 and the inter-layer insulating layer 114 may be formed only in the areas overlapping the plurality of island substrates 111 by patterning. The gate insulating layer 113 and the inter-layer insulating layer 114 may also be made of an inorganic material, equally to the buffer layer 112, so they may be easily damaged such as cracking when the stretchable display device 100 is stretched. Accordingly, the gate insulating layer 113 and the inter-layer insulating layer 114 are patterned in the shape of the plurality of island substrates 111 without being formed in the areas between the plurality of island substrates 111, whereby they can be formed only on the plurality of island substrates 111.

Only a driving transistor of various transistors that may be included in the stretchable display device 100 is shown in FIG. 3 for the convenience of description, but a switching transistor, a capacitor, etc. may be included in the display device. Further, although the transistor 150 is described as having a coplanar structure in this specification, various transistors, for example, having a staggered structure also may be used.

Referring to FIG. 3, a gate pad 171 is disposed on the gate insulating layer 113. The gate pad 171 is a pad for transmitting a gate signal to a plurality of subpixels SPX. The gate pad 171 may be made of the same material as the gate electrode 151, but is not limited thereto.

Referring to FIG. 3, a planarization layer 115 is formed on the transistor 150 and the inter-layer insulating layer 114. The planarization layer 115 planarizes the top of the transistor 150. The planarization layer 115 may be composed of a single layer or a plurality of layers and may be made of an organic material. For example, the planarization layer 115 may be made of an acrylic-based organic material, but is not limited thereto. The planarization layer 115 may have a contact hole for electrically connecting the transistor 150 and an anode 161, a contact hole for electrically connecting a data pad 173 and the source electrode 153, and a contact hole for electrically connecting a connecting pad 172 and a gate pad 171.

In some aspects, a passivation layer may be formed between the transistor 150 and the planarization layer 115. That is, the passivation layer covering the transistor 150 may be formed to protect the transistor 150 from permeation of water, oxygen, etc. The passivation layer may be made of an inorganic material and may be composed of a single layer or a multi-layer, but is not limited thereto.

Referring to FIG. 3, the data pad 173, the connecting pad 172, and the organic light emitting element 160 are disposed on the planarization layer 115.

The data pad 173 may transmit a data signal from a connecting line 180, which functions as a data line, to a plurality of subpixels SPX. The data pad 173 is connected with the source electrode 153 of the transistor 150 through a contact hole formed at the planarization layer 115. The data pad 173 may be made of the same material as the anode 161 of the organic light emitting element 160, but is not limited thereto. Further, the data pad 173 may be made of the same material as the source electrode 153 and the drain electrode 154 of the transistor 150, not on the planarization layer 115, but on the inter-layer insulating layer 114.

The connecting pad 172 may transmit a gate signal from a connecting line 180, which functions as a gate line, to a plurality of subpixels SPX. The connecting pad 172 is connected with the gate pad 171 through contact holes formed at the planarization layer 115 and the inter-layer insulating layer 114 and transmits a gate signal to the gate pad 171. The connecting pad 172 may be made of the same material as the data pad 173, but is not limited thereto.

The organic light emitting elements 160 are components disposed to correspond to the plurality of subpixel SPX, respectively, and emitted light having a specific wavelength band. That is, the organic light emitting element 160 may be a blue organic light emitting element that emits blue light, a red organic light emitting element that emits red light, a green organic light emitting element that emits green light, or a white organic light emitting element that emits white light, but is not limited thereto. When the organic light emitting element 160 is a white organic light emitting element, the stretchable display device 100 may further include a color filter.

The organic light emitting element 160 includes an anode 161, an organic light emitting layer 162, and a cathode 163. In detail, the anode 161 is disposed on the planarization layer 115. The anode 161 is an electrode configured to supply holes to the organic light emitting layer 162. The anode 161 may be made of a transparent conductive material with a high work function. Here, the transparent conductive material may include indium tin oxide (ITO), indium zinc oxide (IZO), and indium tin zinc oxide (ITZO). The anode 161 may be made of the same material as the data pad 173 and the gate pad 171 disposed on the planarization layer 115, but is not limited thereto. Further, when the stretchable display device 100 is implemented in a top emission type, the anode 161 may further include a reflective plate.

The anodes 161 are spaced apart from each other respectively for subpixels SPX and electrically connected with the transistor 150 through a contact hole of the planarization layer 115. For example, although the anode 161 is electrically connected with the drain electrode 154 of the transistor 150 in FIG. 2, the anode 161 may be electrically connected with the source electrode 153.

A bank 116 is formed on the anode 161, the data pad 173, the connecting pad 172, and the planarization layer 115. The bank 116 is a component separating adjacent subpixels SPX. The bank 116 is disposed to cover at least partially both sides of adjacent anodes 161, thereby partially exposing the top surface of the anode 161. The bank 116 may perform a role in suppressing the problem that an unexpected subpixel SPX emits light or colors are mixed by light emitted in the lateral surface direction of the anode 161 due to concentration of a current on the corner of the anode 161. The bank 116 may be made of acrylic-based resin, benzocyclobutene (BCB)-based resin, or polyimide, but is not limited thereto.

The bank 116 has a contact hole for connecting the connecting line 180 functioning as a data line and the data pad 173 and a contact hole for connecting the connecting line 180 functioning as a gate line and the connecting pad 172.

The organic light emitting layer 162 is disposed on the anode 161. The organic light emitting layer 162 is configured to emit light. The organic light emitting layer 162 may include a luminescent material, and the luminescent material may include a phosphorous material or a fluorescent material, but is not limited thereto.

The organic light emitting layer 162 may be composed of one light emitting layer. Alternatively, the organic light emitting layer 162 may have a stacked structure in which a plurality of light emitting layers is stacked with a charge generation layer therebetween. The organic light emitting layer 162 may further include at least one organic layer of a hole transporting layer, an electron transporting layer, a hole blocking layer, an electrode blocking layer, a hole injection layer, and an electron injection layer.

Referring to FIGS. 2 and 3, the cathode 163 is disposed on the organic light emitting layer 162. The cathode 163 supplies electrons to the organic light emitting layer 162. The cathode 163 may be made of indium tin oxide (ITO)-based, indium zin oxide (IZO)-based, indium tin zinc oxide (ITZO)-based, zinc oxide (ZnO)-based, and tin oxide (TO)-based transparent conductive oxides or an Ytterbium (Yb) alloy. Alternatively, the cathode 163 may be made of a metal material.

The cathodes 163 may be formed by patterning to respectively overlap the plurality of island substrates 111. That is, the cathodes 163 may be disposed not in the areas between the plurality of island substrates 111, but only in the areas overlapping the plurality of island substrates 111. Since the cathodes 163 are made of a material, such as transparent conductive oxide or a metal material when the cathodes 163 are formed even in the areas between the plurality of island substrates 111, the cathodes 163 may be damaged when the stretchable display device 100 is stretched/contracted. Accordingly, the cathodes 163 may be formed to respectively correspond to the plurality of island substrates 111 on the plane. Referring to FIGS. 2 and 3, the cathodes 163 may be formed to have an area not overlapping the area where a connection line 180 is disposed, of the areas overlapping the plurality of island substrates 111.

Unlike common organic light emitting display devices, the cathodes 163 are formed by patterning to correspond to the plurality of island substrate 111 in the stretchable display device 100 according to an aspect of the present disclosure. Accordingly, each of the cathodes 163 disposed on the plurality of island substrates 111 may be independently supplied with low-potential power through the connecting lines 180.

Referring to FIGS. 2 and 3, an encapsulation layer 117 is disposed on the organic light emitting element 160. The encapsulation layer 117 may seal the organic light emitting element 160 by covering the organic light emitting element 160 in contact with a portion of the top surface of the bank 116. Accordingly, the encapsulation layer 117 protects the organic light emitting element 160 from water, air, or physical shock that may permeate from the outside.

The encapsulation layers 117 respectively cover the cathodes 163 patterned to respectively overlap the plurality of island substrate 111 and may be formed on the plurality of island substrates 111, respectively. That is, the encapsulation layers 117 are disposed to each cover one cathode 163 disposed on one island substrate 111 and the encapsulation layers 117 disposed on each of the plurality of island substrates 111 may be spaced apart from each other.

The encapsulation layer 117 may be formed only in the areas overlapping the plurality of island substrates 111. As described above, since the encapsulation layers 117 may be configured to include an inorganic layer, they may be easily damaged, such as cracking, when the stretchable display device 100 is stretched. In particular, since the organic light emitting element 160 is vulnerable to water or oxygen, when the encapsulation layer 117 is damaged, reliability of the organic light emitting element 160 may be reduced. Therefore, since the encapsulation layer 117 is not formed in the areas between the plurality of island substrates 111 in the stretchable display device 100 according to an aspect of the present disclosure, damage to the encapsulation layer 117 can be minimized even though the stretchable display device 100 according to an aspect of the present disclosure is deformed, such as, bending or stretching.

Compared with common flexible organic light emitting display devices of the related art, the stretchable display device 100 according to an aspect of the present disclosure has a structure in which the plurality of island substrates 111 that is relatively rigid is spaced apart from each other and disposed on the lower substrate 110 that is relatively flexible. The cathodes 163 and the encapsulation layers 117 of the stretchable display device 100 are disposed by patterning to correspond to the plurality of island substrates 111, respectively. That is, the stretchable display device 100 according to an aspect of the present disclosure may have a structure that enables the stretchable display device 100 to be more easily deformed when a user stretches or bends the stretchable display device 100 and may have a structure that can minimize damage to the components of the stretchable display device 100 when the stretchable display device 100 is deformed.

The connecting lines 180 are lines that electrically connect the pads on the plurality of island substrates 111. The connecting lines 180 include first connecting lines 181 and second connecting lines 182. The first connecting lines 181 are lines extending in an X-axial direction of the connecting lines 180 and the second connecting lines 182 are lines extending in a Y-axial direction of the connecting lines 180.

In common organic light emitting display devices, various lines such as a plurality of gate lines and a plurality of data lines are extended and disposed between a plurality of subpixels, and a plurality of subpixels is connected to one signal line. Accordingly, in common organic light emitting display devices, various lines such as gate lines, data lines, high-potential power lines, and reference voltage lines extend from a side to the other side of the organic light emitting display devices without disconnecting on the substrate.

However, in the stretchable display device 100 according to an aspect of the present disclosure, various lines such as gate lines, data lines, high-potential power lines, and reference voltage lines, which are made of a metal material, are disposed only on the plurality of island substrates 111. That is, in the stretchable display device 100 according to an aspect of the present disclosure, various lines made of a metal material may be disposed only on the plurality of island substrates 111 and may not be formed to be in contact with the lower substrate 110. Accordingly, various lines may be patterned to correspond to the plurality of island substrates 111 and discontinuously disposed.

In the stretchable display device 100 according to an aspect of the present disclosure, the pads on two adjacent island substrates 111 may be connected by a connecting line 180 to connect the discontinuous lines. That is, a connecting line 180 electrically connects the pads on two adjacent island substrates 111. Accordingly, the stretchable display device 100 of the present disclosure includes a plurality of connecting lines 180 to electrically connect various lines such as gate lines, data lines, high-potential power lines, and reference voltage lines between the plurality of island substrates 111. For example, gate lines may be disposed on the plurality of island substrates 111 disposed adjacent to each other in the X-axial direction, and the gate pad 171 may be disposed at both ends of the gate lines. At this time, each of the plurality of gate pads 171 on the plurality of island substrates 111 disposed adjacent to each other in the X-axial direction can be connected to each other by a connecting line 180 functioning as a gate line. Accordingly, the gate line disposed on the plurality of island substrates 111 and the connecting line 180 disposed on the lower substrate 110 can function as one gate line. Further, all various lines that may be included in the stretchable display device 100, such as the data lines, high-potential power lines, and reference voltage lines, also each may function as one line by a connecting line 180, as described above.

Referring to FIG. 2, a first connecting line 181 may connect the pads on two parallel island substrates 111 of the pad of the plurality of island substrates 111 disposed adjacent to each other in the X-axial direction. The first connecting line 181 may function as a gate line or a low-potential power line, but is not limited thereto. For example, the first connecting line 181 may function as a gate line and may electrically connect the gate pads 171 on two X-axially parallel island substrates 111 through a contact hole formed at the bank 116. Accordingly, as described above, the gate pads 171 on a plurality of island substrates 111 disposed in the X-axial direction may be connected by first connecting lines 181 that function as gate lines, and one gate signal may be transmitted.

Referring to FIG. 2, a second connecting line 182 may connect the pads on two parallel island substrates 111 of the pad on the plurality of island substrates 111 disposed adjacent to each other in the Y-axial direction. The second connecting line 182 may function as a data line, a high-potential power line, or a reference voltage line, but is not limited thereto. For example, the second connecting line 182 may function as a data line and may electrically connect the data pads 173 on two Y-axially parallel island substrates 111 through a contact hole formed at the bank 116. Accordingly, as described above, the data pads 173 on the plurality of island substrates 111 disposed in the Y-axial direction may be connected by the plurality of second connecting lines 182 that functions as data lines, and one data signal may be transmitted.

Referring to FIG. 2, the connecting line 180 includes a base polymer and conductive particles. In detail, the first connecting line 181 includes a base polymer and conductive particles and the second connecting line 182 includes a base polymer and conductive particles.

The first connecting line 181 may be formed by extending to the top surface of the lower substrate 110 in contact with the top surface and a side surface of the bank 116, and side surfaces of the planarization layer 115, the inter-layer insulating layer 114, and the buffer layer 112, which are disposed on the island substrate 111, and sides of the plurality of island substrates 111. Accordingly, the first connecting line 181 may be in contact with the top surface of the lower substrate 110, a side surface of an adjacent island substrate 111, and side surfaces of the buffer layer 112, the gate insulating layer 113, the inter-layer insulating layer 114, the planarization layer 115, and the bank 116 disposed on the adjacent island substrate 111. The first connecting line 181 may be in contact with the connecting pads 172 disposed on adjacent island substrates 111, but is not limited thereto.

The base polymer of the first connecting line 181 may be made of a bendable or stretchable insulating material similar to the lower substrate 110. The base polymer, for example, may include styrene butadiene styrene (SBS) etc., but is not limited thereto. Accordingly, when the stretchable display device 100 is bent or stretched, the base polymer may not be damaged. The base polymer may be formed by coating a material configuring the base polymer or applying the material using a slit on the lower substrate 110 and an island substrate 111.

The conductive particles of the first connecting line 181 may be dispersed in the base polymer. In detail, the first connecting line 181 may include conductive particles dispersed with predetermined density in the base polymer. The first connecting line 181, for example, may be formed by uniformly stirring conductive particles in a base polymer and then coating or hardening the base polymer with the conductive particles dispersed therein onto the lower substrate 110 and the island substrate 111, but is not limited thereto. The conductive particles may include at least one of silver (Ag), gold (Au), and carbon, but is not limited thereto.

The conductive particles disposed and dispersed in the base polymer of the first connecting line 181 may form a conductive path electrically connecting the connecting pads 172 each disposed on adjacent island substrates 111. Further, the conductive particles may form a conductive path by electrically connecting a gate pad 171 formed on island substrates 111 disposed on the outermost island substrate 111 of the plurality of island substrate 111 to a pad disposed in the non-active area NA.

Referring to FIG. 2, the base polymer and the conductive particles dispersed in the base polymer of the first connecting line 181 may connect in a straight shape the pads disposed on adjacent island substrates 111. To this end, the base polymers may be formed in a straight shape connecting the pads disposed on each of the plurality of island substrates 111 in the manufacturing process. Accordingly, the conductive paths formed by the conductive particles dispersed in the base polymers also may be a straight shape. However, the shape and the process of forming the base polymer and the conductive particles of the first connecting line 181 may not be limited thereto.

Referring to FIG. 2, the second connecting line 182 may be formed by extending to the top surface of the lower substrate 110 in contact with the top surface and a side surface of the bank 116, and side surfaces of the planarization layer 115, the inter-layer insulating layer 114, and the buffer layer 112, which are formed on the island substrate 111, and side surfaces of the plurality of island substrates 111. Accordingly, the second connecting line 182 may be in contact with the top surface of the lower substrate 110, a side surface of an adjacent island substrate 111, and sides of the buffer layer 112, the gate insulating layer 113, the inter-layer insulating layer 114, the planarization layer 115, and the bank 116 disposed on the adjacent island substrate 111. The second connecting line 182 may be in contact with the data pads 173 disposed on adjacent island substrates 111, but is not limited thereto.

The base polymer of the second connecting line 182 may be made of a bendable or stretchable insulating material similar to the lower substrate 110, and may be made of the same material as the base polymer of the first connecting line 181. The base polymer, for example, may include styrene butadiene styrene (SBS), etc., but is not limited thereto.

Further, the conductive particles of the second connecting line 182 may be dispersed in the base polymer. In detail, the second connecting line 182 may include the conductive particles dispersed with predetermined density in the base polymer. At this time, the conductive particles dispersed at the upper portion and the lower portion in the base polymer of the second connecting line 182 may be substantially the same in density. Further, the manufacturing process of the second connecting line 182 may be the same as that of the first connecting line 181 or may be simultaneously performed.

The conductive particles dispersed in the base polymer of the second connecting line 182 may form a conductive path electrically connecting the data pads 173 respectively disposed on adjacent island substrates 111. Further, the conductive particles may form a conductive path by electrically connecting a data pad 173 formed on the outermost island substrate 111 of the plurality of island substrates 111 to a pad disposed in the non-active area NA.

Referring to FIG. 2, the base polymer of the second connecting line 182 and the conductive particles dispersed in the base polymer may connect, in a straight shape, the pads disposed on adjacent island substrates 111. To this end, the base polymers may be formed in a straight shape connecting the pads disposed on each of the plurality of island substrates 111 in the manufacturing process. Accordingly, the conductive paths formed by the conductive particles dispersed in the base polymers also may be a straight shape. However, the shape and the process of forming the base polymer and the conductive particles of the second connecting line 182 may not be limited thereto.

In some aspects, the conductive particles dispersed in the base polymer of the connecting line 180 may be dispersed and disposed with a density gradient in the base polymer. The density of conductive particles decreases as it goes from the upper portion to the lower portion of a base polymer, so conductivity by conductive particles may be maximum at the upper portion of a base polymer. In detail, the conductive particles may be injected and dispersed in a base polymer by performing an ink printing process, which uses conductive precursors, etc. on the top surface of the base polymer. When the conductive particles are injected into the base polymer, the conductive particles may permeate into empty spaces of the base polymer while the polymer swells several times. Thereafter, the connecting line 180 may be formed by dipping the base polymer with the conductive particles injected into a reducing material or by reducing the base polymer by vapor. Accordingly, the density of the conductive particles in a permeation area at the upper portion of the base polymer may be high such that a conductive path may be formed. The thickness of the permeation area with conductive particles dispersed with high density at the upper portion of the base polymer may depend on the time and intensity for injecting the conductive particles through the top surface of the base polymer. For example, when the time or intensity for injecting the conductive particles through the top surface of the base polymer increases, the thickness of the permeation area may also increase. Each of the conductive particles may be in contact with each other at the upper portion of the base polymer, so a conductive path is formed by the conductive particles being in contact with each other, and accordingly, an electrical signal may be transmitted.

In some aspects, the base polymer of the connecting line 180 may be formed as a single layer between adjacent island substrates 111 on the lower substrate 110. In detail, a base polymer, unlike FIG. 2, may be disposed as a single layer in the area between island substrates 111, which are most adjacent to each other in the X-axial direction, in contact with the lower substrate 110. The base polymer may be formed to overlap all of a plurality of pads disposed in parallel at a side on one island substrate 111. The conductive particles may be separately formed to form a plurality of conductive paths on a base polymer, which is disposed as one layer, and respectively correspond to a plurality of pads. Accordingly, the conductive paths formed by the conductive particles may connect in a straight shape the pads disposed on adjacent island substrates 111. For example, the conductive particles may be injected to form four conductive paths on a top surface of the base polymer disposed as one layer between the plurality of island substrates 111.

Further, in some aspects, the base polymers of the connecting lines 180 may be disposed in all areas excepting the areas where a plurality of island substrates 111 is disposed. The base polymers may be disposed as single layers in contact with the lower substrate 110, on the plurality of rigid substrates of the lower substrate 110, which is, in the other areas excepting the areas overlapping a plurality of island substrates 111. Accordingly, since the other areas of the lower substrate 110 excepting the areas overlapping the plurality of island substrates 111 in the lower substrate 110 may be covered with the base polymers and the base polymers may be in contact with the pads of the plurality of island substrates 111, some of the base polymers may be disposed to cover edges of the plurality of island substrates 111. Further, the conductive particles may form a conductive path connecting the pads on the plurality of adjacent island substrates 111 on the base polymer.

When the base polymers are disposed as single layers in all areas excepting the areas having a plurality of island substrates 111 on the lower substrate 110, the base polymers may be formed by being applied to all areas excepting the areas having the plurality of island substrates 111 on the lower substrate 110. Accordingly, there may be no need for a separate process for patterning the base polymer. Accordingly, the process of manufacturing the base polymers and the connecting lines can be simplified, and the manufacturing costs and time can be reduced.

Further, since the base polymers are disposed as single layers in all areas excepting the areas having the plurality of island substrates 111 on the lower substrate 110, the force that is applied when the stretchable display device 100 is bent or stretched may be dispersed. Further, in some aspects, the top surface of the base polymer of the connecting line 180 may be flat. In detail, unlike FIG. 3, the top surface of the base polymer of the connecting line 180 such as a gate line and a data line may be higher than the top surface of the planarization layer 115 on the plurality of island substrates 111. Further, the top surface of the base polymer may be higher than the top surface of the bank 116 on the plurality of island substrates 111. Accordingly, for the base polymer of the connecting line 180, the height of the top surface of the portion overlapping the plurality of island substrates 111 and the height of the top surface of the areas disposed between the plurality of island substrates 111 may be the same. Accordingly, the top surface of the connecting line 180 may be flat. Therefore, the top surface of the conductive particles dispersed at the upper portion in the base polymer may be a straight shape without a curve in a cross-sectional view.

A step may exist between the top surface of the bank 116 and the top surface of the lower substrate 110 due to various components on the plurality of island substrates 111 spaced and disposed on the lower substrate 110. In this case, the base polymer itself may be cut by a step on the top surface of the base polymer, so the electrical path between the pads disposed on adjacent island substrates 111 may be cut and a percentage defective of the stretchable display device may increase.

At this time, when the top surface of the base polymer is flat, the step between the top surface of the elements disposed on the plurality of island substrates 111 and the top surface of the lower substrate 110 without the plurality of island substrates 111 may be removed. Accordingly, a cutting phenomenon of the connecting lines 180 including a base polymer and conductive particles due to a step may be suppressed even though the stretchable display device 100 is bent or stretched. Further, the top surface of a base polymer is flat in a stretchable display device 100 according to another aspect of the present disclosure, so damage to the connecting lines 180 in the manufacturing process of the stretchable display device 100 can be minimized.

Referring back to FIG. 3, the upper substrate 120, the polarizing layer 190, and the lower adhesive layer 118 are disposed on the encapsulation layer 117 and the lower substrate 110.

The upper substrate 120 is a substrate supporting various components disposed under the upper substrate 120. The upper substrate 120, which is a flexible substrate, may be made of a bendable or stretchable insulating material. The upper substrate 120, which is a flexible substrate, may reversibly expand and contract. Further, an elastic modulus may be several to hundreds of MPa and a tensile fracture rate may be 100% or more. The thickness of the upper substrate 120 may be 10 μm to 1 mm, but is not limited thereto.

The upper substrate 120 may be made of the same material as the lower substrate 110, for example, silicon rubber such as polydimethylsiloxane (PDMS) or an elastomer such as polyurethane (PU), so it can have flexibility. The material of the upper substrate 120, however, is not limited thereto.

The upper substrate 120 may be formed in a film type. Accordingly, the upper substrate 120 and the lower substrate 110 can be bonded through the lower adhesive layer 118 disposed under the upper substrate 120 by applying pressure to the upper substrate 120 and the lower substrate 110. However, the present disclosure is not limited thereto, and the lower adhesive layer 118 may be omitted, depending on aspects. Further, the upper substrate 120 may be formed not in a film type, but in a coating method, and in this case, the lower adhesive layer 118 may be omitted.

The polarizing layer 190 is disposed on the upper substrate 120. The polarizing layer 190 polarizes light incident into the stretchable display device 100 from the outside. The light incident and polarized in the stretchable display device 100 through the polarizing layer 190 may be reflected in the stretchable display device 100, so the phase of the light may be changed. The light with the changed phase may not pass through the polarizing layer 190. Accordingly, light incident in the stretchable display device 100 from the outside of the stretchable display device 100 is not discharged back to the outside of the stretchable display device 100, so the external light reflection of the stretchable display device 100 can be reduced.

A stretchable display device needs an easily bending or stretching characteristic, so there have been attempts to use substrates that have a flexible property due to a small modulus. However, when a flexible material such as polydimethylsiloxane (PDMS) having a small modulus is used as a lower substrate that is disposed in the process of manufacturing display elements, there is a problem that the substrate is damaged by high temperature, for example, temperature over 100° C. that is generated in the process of forming transistors and the display elements due to the characteristic that a material having a small modulus is vulnerable to heat.

Accordingly, the display elements needs to be formed on a substrate made of a material that can withstand a high temperature, so damage to the substrate can be suppressed in the process of manufacturing the display elements. Accordingly, there have been attempts to manufacture a substrate using materials that can withstand a high temperature, which is generated in the manufacturing process, such as polyimide (PI). However, the materials that can withstand a high temperature do not have a flexible property due to a large modulus, so the substrates are not easily bent or stretched when the stretchable display devices are stretched.

Therefore, the plurality of island substrates 111 having a rigid characteristic is disposed only in the areas where transistors 150 or organic light emitting elements 160 are disposed in the stretchable display device 100 according to an aspect of the present disclosure. Accordingly, damage to the plurality of island substrates 111 due to a high temperature in the process of manufacturing the transistors 150 or the organic light emitting elements 160 can be suppressed.

Further, the lower substrate 110 and the upper substrate 120 that are flexible substrates may be disposed under and over the plurality of island substrates 111 in the stretchable display device 100 according to an aspect of the present disclosure. Accordingly, the other areas of the lower substrate 110 and the upper substrate 120 excepting the areas overlapping the plurality of island substrates 111 can be easily stretched or bent, so the stretchable display device 100 can be achieved. Further, it is possible to suppress the damage of the stretchable display device 100 by the transistors 150, the organic light emitting elements 160, etc. disposed on the plurality of island substrates 111 that is rigid substrates when the stretchable display device 100 is bent or stretched.

Meanwhile, when a stretchable display device is bent or stretched, a lower substrate that is flexible can be deformed and island substrates that are rigid and where organic light emitting elements are disposed may not be deformed. In this case, if the lines connecting each of the pads disposed on the plurality of island substrates are not made of an easily bendable or stretchable material, the lines may be damaged, such as cracking, due to deformation of the lower substrate.

Unlike this, in the stretchable display device 100 according to an aspect of the present disclosure, it is possible to electrically connect the pads disposed on each of the plurality of island substrates 111, using the connecting lines 180 including a base polymer and conductive particles. The base polymer is flexible to be able to be easily deformed. Accordingly, the stretchable display device 100 of an aspect of the present disclosure has an effect that even though the stretchable display device 100 is deformed such as bending or stretching, the areas between the plurality of island substrates 111 can be easily deformed by the connecting lines 180 including the base polymer.

Further, according to the stretchable display device 100 of an aspect of the present disclosure, since the connecting lines 180 include conductive particles, the conductive paths composed of the conductive particles may not be damaged such as cracking even by deformation of the base polymer. For example, when the stretchable display device 100 is deformed such as bending or stretching, the lower substrate 110 that is a flexible substrate may be deformed in the other areas excepting the areas where the plurality of island substrates 111 that is rigid substrates is disposed. At this time, the distance between the plurality of conductive particles disposed on the deforming lower substrate 110 may be changed. At this time, the density of the plurality of conductive particles disposed at the upper portion of the base polymers and forming the conductive paths may be maintained at a high level to be able to transmit electrical signals even though the distance between the plurality of conductive particles is increased. Accordingly, even if the base polymers are bent or stretched, the conductive paths formed by the plurality of conductive particles may smoothly transmit electrical signals. Further, even though the stretchable display device 100 is deformed such as bending or stretching, electrical signals may be transmitted each between the pads.

In the stretchable display device 100 according to an aspect of the present disclosure, since the connecting lines 180 include a base polymer and conductive particles, the connecting lines 180 respectively connecting the pads disposed on the plurality of adjacent island substrates 111 may be disposed in a straight shape to make a shortest distance. That is, the stretchable display device 100 may be achieved even if the connecting lines 180 are not formed in a curved shape. The conductive particles of the connecting lines 180 are dispersed in the base polymers and form conductive paths. Further, when the stretchable display device 100 is deformed such as bending or stretching, the conductive paths formed by the conductive particles may be bent or stretched. In this case, only the distance between the conductive particles is changed and the conductive paths formed by the conductive particles can still transmit electrical signals. Therefore, in the stretchable display device 100 according to an aspect of the present disclosure, it is possible to minimize the space occupied by the connecting lines 180.

Figure 4:
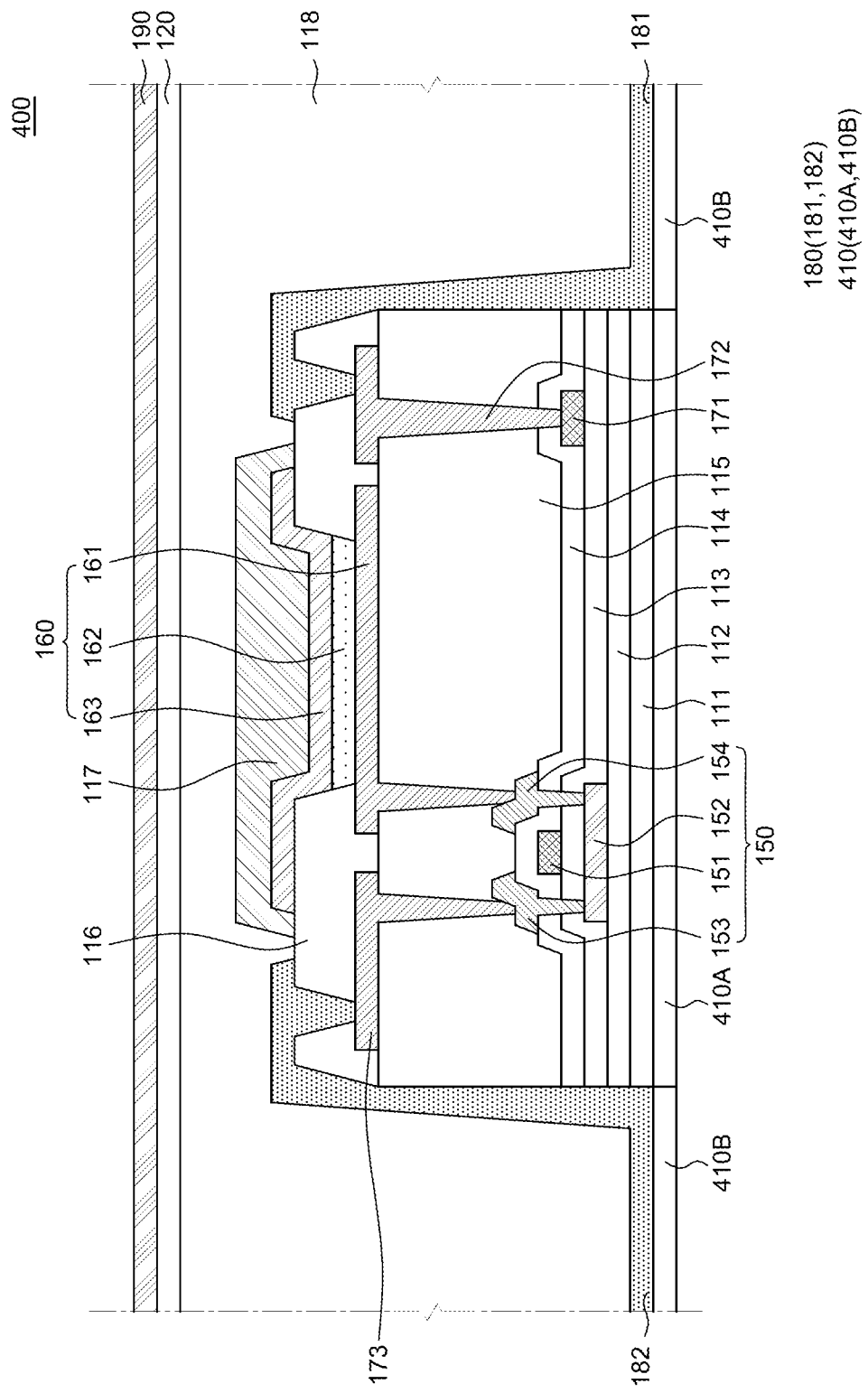
FIG. 4 is a schematic cross-sectional view of one subpixel of a stretchable display device according to another aspect of the present disclosure.

FIG. 4 is a schematic cross-sectional view of one subpixel of a stretchable display device according to another aspect of the present disclosure. A stretchable display device 400 shown in FIG. 4 is substantially the same as the stretchable display device 100 shown in FIGS. 1 to 3 except for having a different lower substrate 410, so repeated description is omitted.

Referring to FIG. 4, the lower substrate 410 includes a plurality of first lower patterns 410A and second lower patterns 410B. The plurality of first lower patterns 410A is disposed in the areas overlapping a plurality of island substrates 111 on the lower substrate 410. The plurality of first lower patterns 410A may be disposed under the plurality of island substrates 111 with the top surfaces bonded to the bottom surfaces of the plurality of island substrates 111.

The second lower patterns 410B are disposed in areas excepting the plurality of first lower patterns 410A on the lower substrate 410. The second lower patterns 410B may be disposed in the same plane as the plurality of the first lower patterns 410A while surrounding the plurality of first lower patterns 410A. The second lower patterns 410B are disposed under connecting lines 180 and a lower adhesive layer 118 with the top surfaces in contact with the bottom surfaces of the connecting lines 180 and the bottom surface of the lower adhesive layer 118.

In this case, the plurality of first lower patterns 410A may be larger in modulus than the second lower patterns 410B. Accordingly, the plurality of first lower patterns 410A may be a plurality of rigid lower patterns that is more rigid than the second lower patterns 410B. The second lower patterns 410B may be flexible lower patterns that are more flexible than the plurality of first lower patterns 410A. The modulus of the plurality of first lower patterns 410A may be at least a thousand times larger than those of the second lower patterns 410B, but is not limited thereto.

The plurality of first lower patterns 410A may be made of the same material as the plurality of island substrates 111, may be made of a plastic material having flexibility, and for example, may be made of polyimide (PI), polyacrylate, polyacetate, or the like. However, the plurality of first lower patterns 410A is not limited thereto and may be made of a material having a modulus that is the same as or smaller than those of the plurality of island substrates 111.

The second lower patterns 410B may be disposed in the same plane as the plurality of first lower patterns 410A and may be disposed to surround the plurality of first lower patterns 410A. The second lower patterns 410B, which are flexible lower patterns, may reversely expand and contract and may have an elastic modulus of several to hundreds of MPa and a tensile fracture rate of 100% or more. Accordingly, the second lower patterns 410B may be made of a bendable or stretchable insulating material and may be made of silicon rubber such as polydimethylsiloxane (PDMS) or an elastomer such as polyurethane (PU), but are not limited thereto. The thickness of the second lower patterns 410B may be 10 □m to 1 mm and the thickness of the first lower patterns 410A may be 1 □m to the thickness of the second lower patterns 410B.

In the stretchable display device 400 according to another aspect of the present disclosure, the lower substrate 410 includes the plurality of first lower patterns 410A overlapping with the plurality of island substrates 111 and the second lower patterns 410B except for the plurality of first lower patterns 410A. Further, the plurality of first lower patterns 410A is larger in modulus than the second lower patterns 410B. When the stretchable display device 400 is deformed such as bending or stretching, the plurality of first lower patterns 410A disposed under the plurality of island substrates 111 that is rigid substrates may support the plurality of island substrates 111 as rigid lower patterns. Accordingly, various elements disposed on the plurality of island substrates 111 may be supported together with the plurality of island substrates 111 by the plurality of first lower patterns 410A and damage to the elements due to deformation of the stretchable display device 400 may be reduced.

Further, when the stretchable display device 400 is deformed such as bending or stretching, the plurality of first lower patterns 410A is made of the same material as the plurality of island substrates 111 and has a modulus higher than the second lower patterns 410B. Accordingly, when the stretchable display device 400 is deformed such as bending or stretching, the plurality of first lower patterns 410A may be stretched more than the plurality of island substrates 111 without deformation, and the plurality of first lower patterns 410A and the plurality of island substrates 111 may keep firmly bonded to each other. Therefore, since the plurality of first lower patterns 410A and the plurality of island substrates 111 can keep firmly bonded to each other in the stretchable display device 400 according to another aspect of the present disclosure, defect of the stretchable display device 400 can be reduced even if the stretchable display device 400 is continuously deformed such as bending or stretching.

Since the second lower patterns 410B not overlapping the plurality of island substrates 111 are more flexible than the plurality of first lower patterns 410A, the areas where the second lower patterns 410B are disposed between the plurality of island substrates 111 may be freely bent or stretched. Accordingly, the connecting lines 180 overlapping the second lower patterns 410B also may be freely bent or stretched. Therefore, the stretchable display device 400 according to another aspect of the present disclosure can be more easily deformed such as bending or stretching.

Further, the lower substrate 410, and the upper substrate 120 and the polarizing layer 190 disposed on the plurality of island substrates 111 are formed in a single layer, respectively, in the stretchable display device 400 according to an aspect of the present disclosure. Accordingly, it is possible to suppress in advance a problem with alignment that may be generated in the process of bonding the upper substrate 120 and the polarizing layer 190 to the lower substrate 410 and the plurality of island substrates 111.

Figure 5:
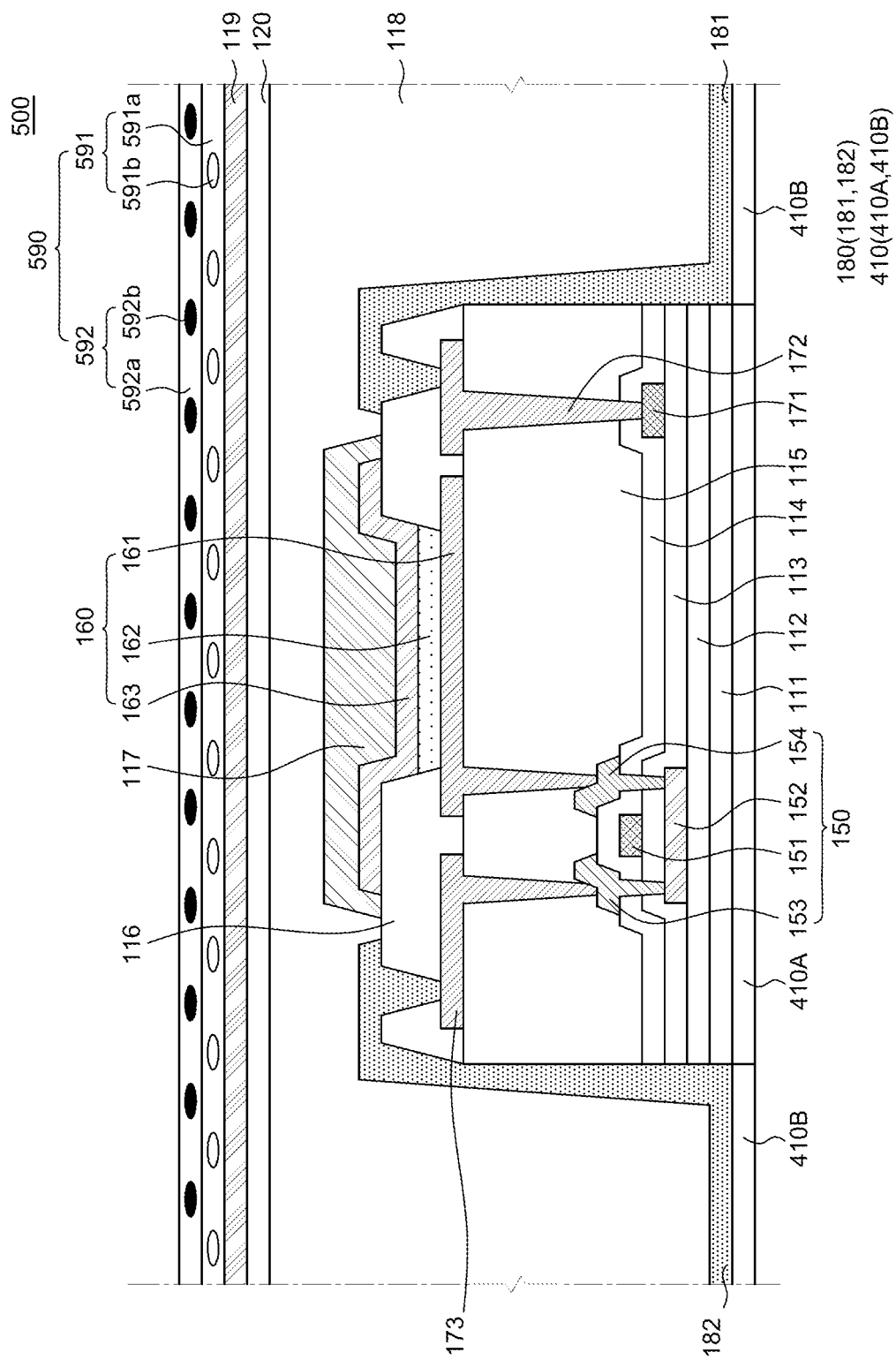
FIG. 5 is a schematic cross-sectional view of one subpixel of a stretchable display device according to another aspect of the present disclosure.
Figure 6A:
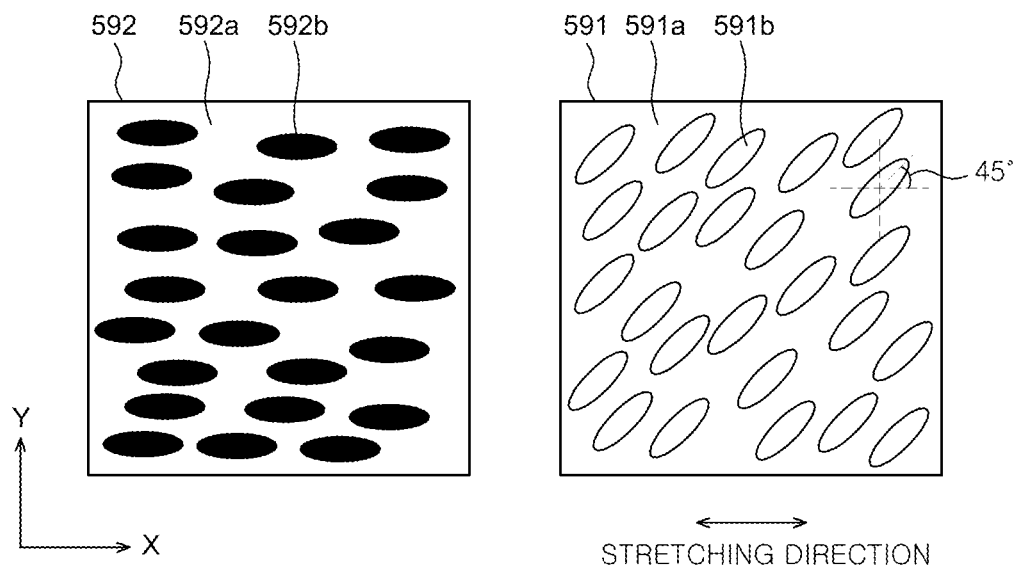
FIGS. 6A, 6B, and 6C are schematic plan views of a polarizing layer of a stretchable display device according to another aspect of the present disclosure.
Figure 6B:
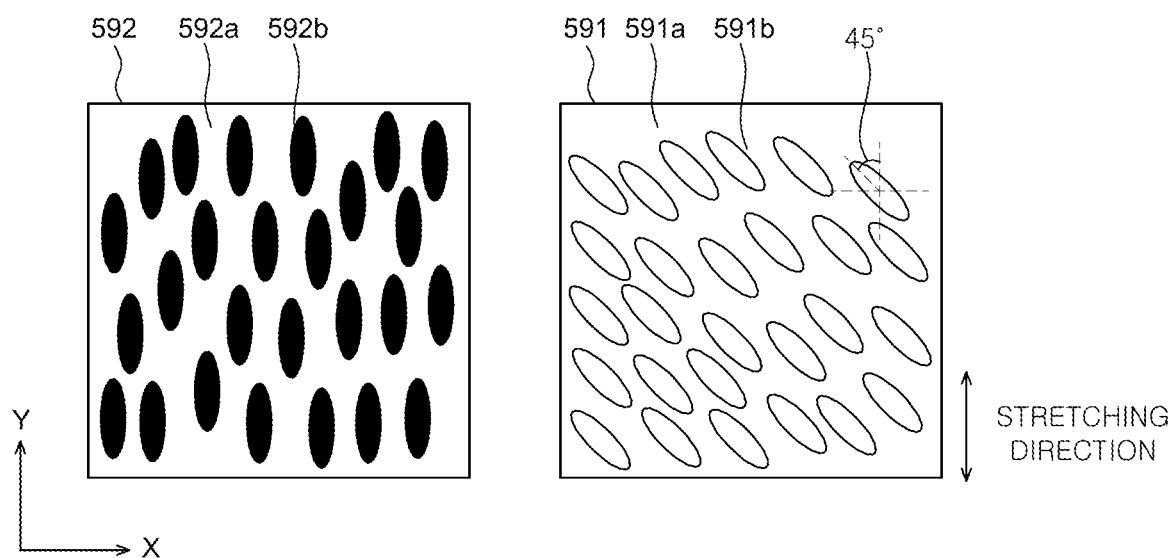
Figure 6C:
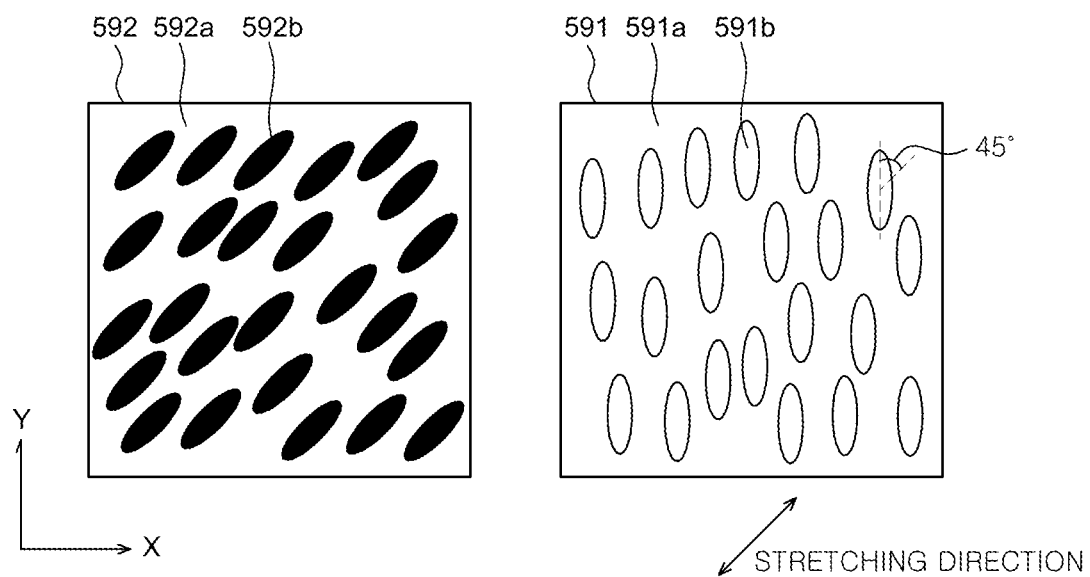

FIG. 5 is a schematic cross-sectional view of one subpixel of a stretchable display device according to another aspect of the present disclosure and FIGS. 6A, 6B, and 6C are schematic plan views of a polarizing layer of a stretchable display device according to another aspect of the present disclosure. The stretchable display device 500 of FIGS. 5 to 6C are substantially the same as the stretchable display devices 100 and 400 of FIGS. 1 to 4, except for an additional upper adhesive layer 119 and the structure of the polarizing layer 190, so repeated description is omitted.

Referring to FIG. 5, the upper substrate 120 may be formed in a film type and attached to the lower substrate 410 by the lower adhesive layer 118. Further, a polarizing layer 590 may also be formed in a film type and attached to the upper substrate 120 by an upper adhesive layer 119. That is, the upper substrate 120 and the polarizing layer 590 are attached in a way that the upper adhesive layer 119 is attached to the bottom surface of the polarizing layer 590 and the upper substrate 120 is attached to the bottom surface of the upper adhesive layer 119. The upper adhesive layer 119 may be made of the same material as the lower adhesive layer 118, but is not limited thereto.

The polarizing layer 590 includes a phase delay layer 591 disposed on the upper substrate 120 and a linear polarizing plate 592 disposed on the phase delay layer 591.

The linear polarizing plate 592 can linearly polarize external light incident into the linear polarizing plate 592 at a specific angle. The linear polarizing plate 592 includes a second base polymer 592a and a dye 592b dispersed on the second base polymer 592a. The second base polymer 592a, which is a member for providing flexibility to the linear polarizing plate 592, may be made a flexible material such as silicon rubber such as polydimethylsiloxane (PDMS), an elastomer such as polyurethane (PU), SBS, or ecoflex, but is not limited thereto. Further, the second base polymer 592a may be made of the same material as the upper substrate 120 or the second lower pattern 410B of the lower substrate 410, but is not limited thereto. The dye 592b, which is a configuration for polarizing external light at 90 degrees, may be a dichromatic dye 592b, but is not limited thereto, and various materials that can polarize external light at specific angles may be used. The linear polarizing plate 592 may be formed in a way of applying a mixture of which the dye 592b is dispersed in the second base polymer 592a to an alignment layer and then aligning and hardening the dye 592b.

The phase delay layer 591 may have a transmission axis of −45 degrees or +45 degrees with respect to the angle at which the linear polarizing plate 592 linearly polarizes external light. Accordingly, external light incident into the phase delay layer 591 may be circularly polarized through the phase delay layer 591. The phase delay layer 591 may include a first base polymer 591a and reactive mesogen 591b dispersed in the first base polymer 591a. The first base polymer 591a, which is a member for giving flexibility to the phase delay layer 591, may be made a flexible material such as silicon rubber such as polydimethylsiloxane (PDMS), an elastomer such as polyurethane (PU), SBS, and ecoflex, but is not limited thereto. Further, the first base polymer 591a may be made of the same material as the second base polymer 592a and the upper substrate 120, but is not limited thereto. The reactive mesogen 591b is configured to circularly polarize external light at −45 degrees or +45 degrees with respect to the angle at which the linear polarizing plate 592 linearly polarizes external light, but is not limited thereto and various materials that can circularly polarize external light at −45 degrees or +45 degrees with respect to the angle at which the linear polarizing plate 592 linearly polarizes external light. The linear polarizing plate 592 may be formed in a way of applying a mixture of which the reactive mesogen is dispersed in the first base polymer 591a to an alignment layer and then aligning and hardening the reactive mesogen 591b.

As described above, since the polarizing layer 590 includes the phase delay layer 591 and the linear polarizing plate 592, so the polarizing layer 590 may reduce reflection of external light. For example, non-polarized external light is incident into the linear polarizing plate 592. The linear polarizing plate 592 can linearly polarize external light incident into the linear polarizing plate 592, for example, at 90 degrees. Since the phase delay layer 591 has a transmission axis of 45 degrees or −45 degrees from 90 degrees, external light that has passed through the phase delay layer 591 is circularly polarized. The circularly polarized external light is reflected by another component of the stretchable display device 500 and then linearly polarized again at 0 degrees or 180 degrees through the phase delay layer 591. The external light polarized at 0 degrees or 180 degrees is different from the transmissive axis of the linear polarizing layer 590, so it may be mostly absorbed in the linear polarizing layer 590. Accordingly, the polarizing layer 590 of the stretchable display device 500 according to another aspect of the present disclosure may reduce reflection of external light.

Referring to FIGS. 6A, 6B, and 6C, the polarizing layer 590 may be configured on the basis of the stretchable direction of the stretchable display device 500. It may be designed to be stretchable in one specific direction in the initial manufacturing step of the stretchable display device 500. The stretchable display device 500 may have a stretching characteristic to be stretchable in a plurality of directions, but the stretchable display device 500 may be implemented to be stretchable in one specific direction through design of a case, etc. that a user uses to stretch the stretchable display device 500. Accordingly, in the stretchable display device 500 according to another aspect of the present disclosure, the phase delay layer 591 and the linear polarizing plate 592 may be configured to have a polarization axis corresponding to the stretchable direction of the stretchable display device 500.

First, referring to FIG. 6A, it is assumed that the stretchable display device 500 has been implemented to be stretchable in an X-axial direction. At this time, the dye 592b of the linear polarizing plate 592 is aligned in a first direction in the second base polymer 592a and the reactive mesogen 591b of the phase delay layer 591 is aligned in a −45 degrees or +45 degrees direction with respect to the first direction in the first base polymer 591a. In detail, when the stretching direction of the stretchable display device 500 is the X-axial direction, the dye 592b of the linear polarizing plate 592 may be aligned in the first direction that is the same as the X-axial direction and the reactive mesogen 591b of the phase delay layer 591 may be aligned in a −45 degrees or +45 degrees direction with respect to the first direction. Only the case when the reactive mesogen 591b of the phase delay layer 591 is aligned in a +45 degrees direction with respect to the first direction is shown in FIG. 6A for the convenience of description, but the reactive mesogen 591b of the phase delay layer 591 may be aligned in a −45 degrees direction with respect to the first direction.

Similarly, referring to FIG. 6B, it is assumed that the stretchable display device 500 has been implemented to be stretchable in a Y-axial direction. When the stretching direction of the stretchable display device 500 is the Y-axial direction, the dye 592b of the linear polarizing plate 592 may be aligned in the first direction that is the same as the Y-axial direction and the reactive mesogen 591b of the phase delay layer 591 may be aligned in a −45 degrees or +45 degrees direction with respect to the first direction. Only the case when the reactive mesogen 591b of the phase delay layer 591 is aligned in a +45 degrees direction with respect to the first direction is shown in FIG. 6B for the convenience of description, but the reactive mesogen 591b of the phase delay layer 591 may be aligned in a −45 degrees direction with respect to the first direction.

Further, referring to FIG. 6C, it is assumed that the stretchable display device 500 has been implemented to be stretchable in a direction between the X-axis and the Y-axis. The X-axis direction and Y-axis direction are positioned in a plane parallel to the display surface and are referenced to the typical viewing orientation. When the stretching direction of the stretchable display device 500 is a direction between the X-axis and the Y-axis, for example, a 45 degrees direction, the dye 592b of the linear polarizing plate 592 may be aligned in the first direction that is the same as the 45 degrees direction and the reactive mesogen 591b of the phase delay layer 591 may be aligned in a −45 degrees or +45 degrees direction, that is, the X-axial direction or the Y-axial direction with respect to the first direction. Only the case when the reactive mesogen 591b of the phase delay layer 591 is aligned in a +45 degrees direction with respect to the first direction is shown in FIG. 6C for the convenience of description, but the reactive mesogen 591b of the phase delay layer 591 may be aligned in a −45 degrees direction with respect to the first direction.

A polarizing layer that is used in general display devices is made of a material having rigidity. Accordingly, when a general polarizing layer is applied to a stretchable display device, there is a problem that stress is applied to the polarizing layer in the process of stretching the stretchable display device and the polarizing layer is damaged.

Accordingly, in the stretchable display device 500 according to another aspect of the present disclosure, it is possible to reduce damage to the polarizing layer 590 when the stretchable display device 500 is stretched, by using a flexible material for the linear polarizing plate 592 and the phase delay layer 591 constituting the polarizing layer 590. In detail, the second base polymer 592a that is a base member constituting the linear polarizing plate 592 and the first base polymer 591a that is a base member constituting the phase delay layer 591 are made of a flexible material, the same as the upper substrate 120, so when the stretchable display device 500 is stretched, the polarizing layer 590 may also be stretched together, in which stress that is applied to the polarizing layer 590 may be reduced and damage to the polarizing layer 590 may be reduced. Accordingly, in the stretchable display device 500 according to another aspect of the present disclosure, external light reflection may be more efficiently reduced.

Further, in the stretchable display device 500 according to another aspect of the present disclosure, the polarizing layer 590 may be configured on the basis of the stretchable direction of the stretchable display device 500. That is, when the stretchable display device 500 is implemented to be stretchable in the first direction, the dye 592b of the linear polarizing plate 592 may also be aligned in the first direction in the second base polymer 592a and the reactive mesogen 591b of the phase delay layer 591 may be aligned in a −45 degrees or +45 degrees direction with respect to the first direction in the first base polymer 591a. If the stretching direction of the stretchable display device 500 and the alignment direction of the dye 592b of the linear polarizing plate 592 are different, the polarizing layer 590 may be stretchable together with the stretchable display device 500, but the external light reflection efficiency may rapidly drop. Accordingly, in the stretchable display device 500 according to another aspect of the present disclosure, it is possible to improve the external light reflection efficiency by aligning the dye 592b of the linear polarizing plate 592 in the same as the stretchable direction of the stretchable display device 500.

Figure 7:
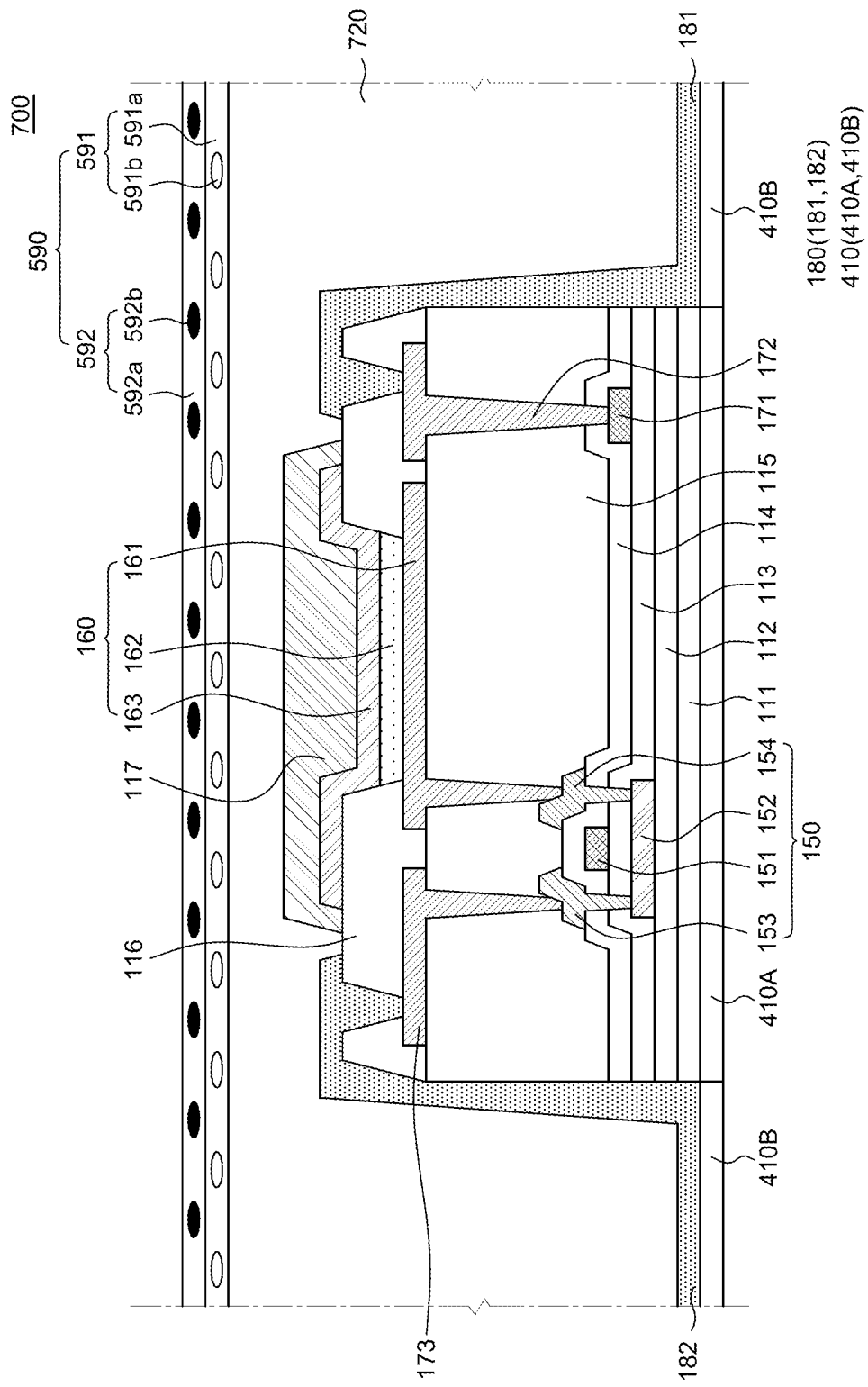
FIG. 7 is a schematic cross-sectional view of one subpixel of a stretchable display device according to another aspect of the present disclosure.

FIG. 7 is a schematic cross-sectional view of one subpixel of a stretchable display device according to another aspect of the present disclosure. A stretchable display device 700 of FIG. 7 is substantially the same as the stretchable display device 500 shown in FIGS. 5 to 6C except that the upper substrate 720 is different and the upper adhesive layer 119 and the lower adhesive layer 118 are omitted, so repeated description is omitted.

Referring to FIG. 7, the upper substrate 720 is disposed in contact with the lower substrate 410, the island substrate 111, and the connecting line 180. In detail, the upper substrate 720 may be formed in a way of coating a material constituting the upper substrate 720 onto the lower substrate 410 and the island substrate 111 and then hardening the material. Accordingly, the upper substrate 720 may be disposed in contact with the lower substrate 410, the island substrate 111, and the connecting line 180.

At this time, the phase delay layer 591 disposed on the upper substrate 720 may be made of the same base material as the upper substrate 720. That is, the first base polymer 591a constituting the phase delay layer 591 may be made of the same material as the upper substrate 720.

Accordingly, in the stretchable display device 700 according to another aspect of the present disclosure, the upper substrate 720 is formed in a way of coating a material constituting the upper substrate 720 onto the lower substrate 410 and the island substrate 111 and then hardening the material, it is possible to bond the upper substrate 720 to the lower substrate 410, the island substrate 111, and the connecting line 180 even without configuring the lower adhesive layer 118. Accordingly, it is possible to reduce the thickness of the stretchable display device 700.

Further, in the stretchable display device 700 according to another aspect of the present disclosure, since the first base polymer 591a constituting the phase delay layer 591 may be made of the same material as the material constituting the upper substrate 720, the upper adhesive layer 119 may not be disposed between the upper substrate 720 and the polarizing layer 590. Accordingly, the thickness of the stretchable display device 700 may be reduced.

Further, in the process of forming the upper substrate 720, for example, when the polarizing layer 590 is attached to the upper substrate 720 in a half-hardened state and the upper substrate 720 is completely hardened, the upper substrate 720 and the polarizing layer 590 may be more strongly bonded. The bonding force is stronger when the same materials are attached in comparison to when different materials are attached. As described above, since the upper substrate 720 and the first base polymer 591a of the phase delay layer 591 may be made of the same material, the bonding force between the upper substrate 720 and the phase delay layer 591 in the stretchable display device 700 according to another aspect of the present disclosure may be stronger than when the upper substrate 720 and the phase delay layer 592 are attached using a separate adhesive layer.

Figure 8:
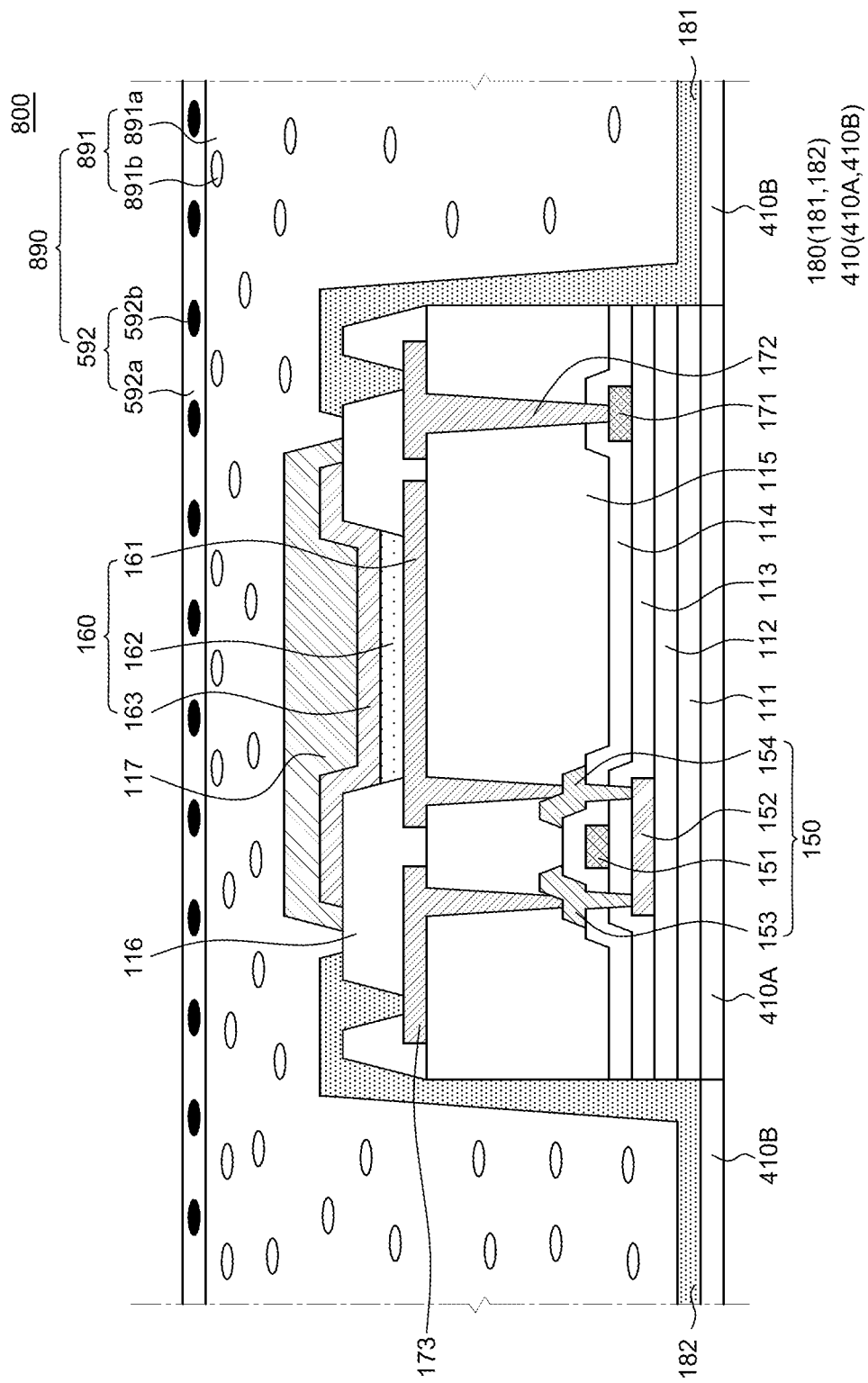
FIG. 8 is a schematic cross-sectional view of one subpixel of a stretchable display device according to another aspect of the present disclosure.

FIG. 8 is a schematic cross-sectional view of one subpixel of a stretchable display device according to another aspect of the present disclosure. The stretchable display device 800 of FIG. 8 is substantially the same as the stretchable display device 700 of FIG. 7 except that the upper substrate 720 and a phase delay layer 891 of a polarizing layer 890 are integrated and the upper substrate 720 is omitted, so repeated description is omitted.

Referring to FIG. 8, the phase delay layer 891 is disposed in contact with the lower substrate 410, the island substrate 111, and the connecting line 180. As described above, since the upper substrate 720 and the first base polymer 891a constituting the phase delay layer 891 may be made of the same material, the upper substrate 720 may be omitted and the phase delay layer 891 may perform the function of the upper substrate 720 instead. Accordingly, the phase delay layer 891 may perform also the function of the upper substrate 720 by being disposed in contact with the lower substrate 410, the island substrate 111, and the connecting line 180.

Accordingly, in the stretchable display device 800 according to another aspect of the present disclosure, the upper substrate 720 and the phase delay layer 891 may be integrally configured by configuring the upper substrate 720 and the phase delay layer 891 using the same material. Accordingly, in the stretchable display device 800 according to another aspect of the present disclosure, it is possible to reduce the thickness of the stretchable display device 800 by integrating the upper substrate 720 and the phase delay layer 891.

Figure 9:
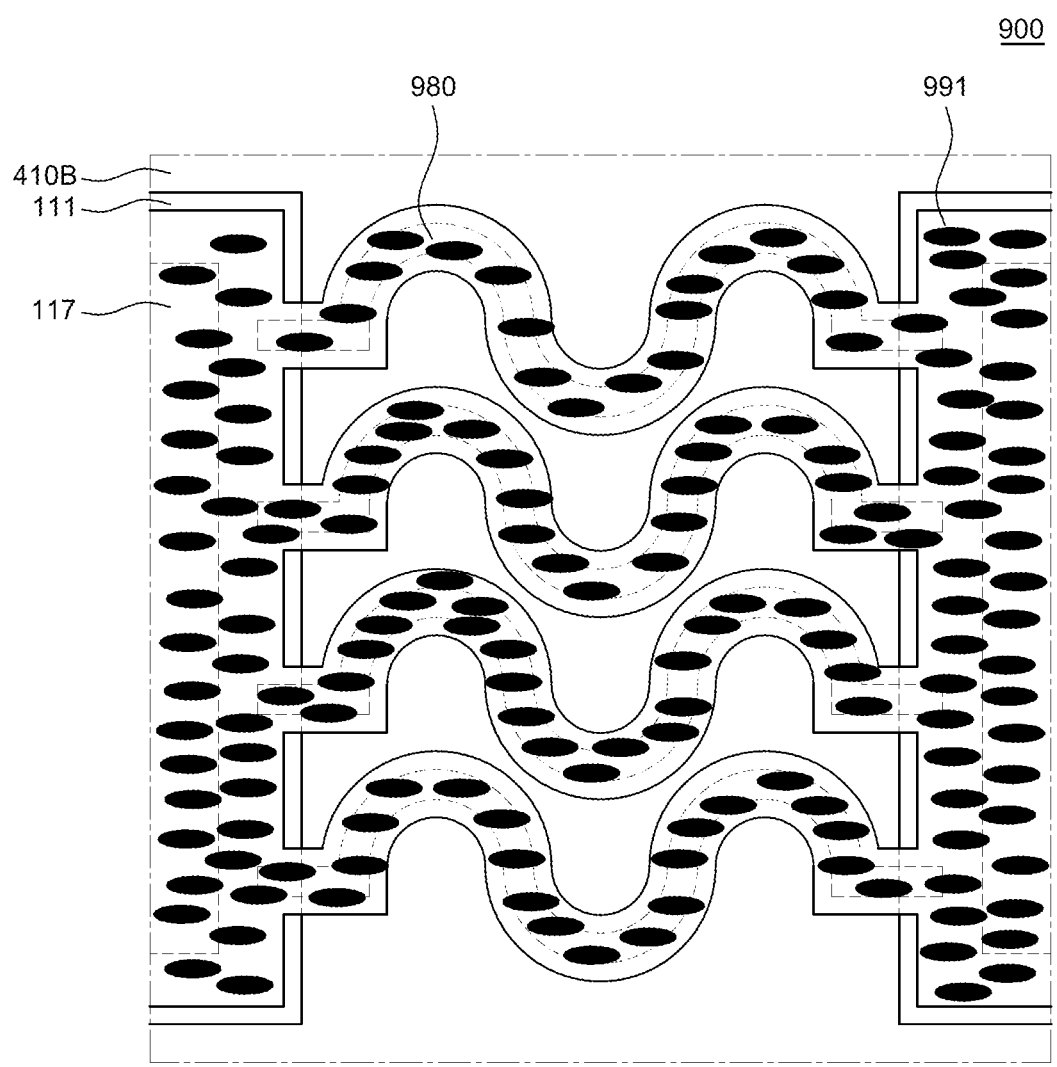
FIG. 9 is an enlarged plan view of a stretchable display device according to another aspect of the present disclosure.
Figure 10:
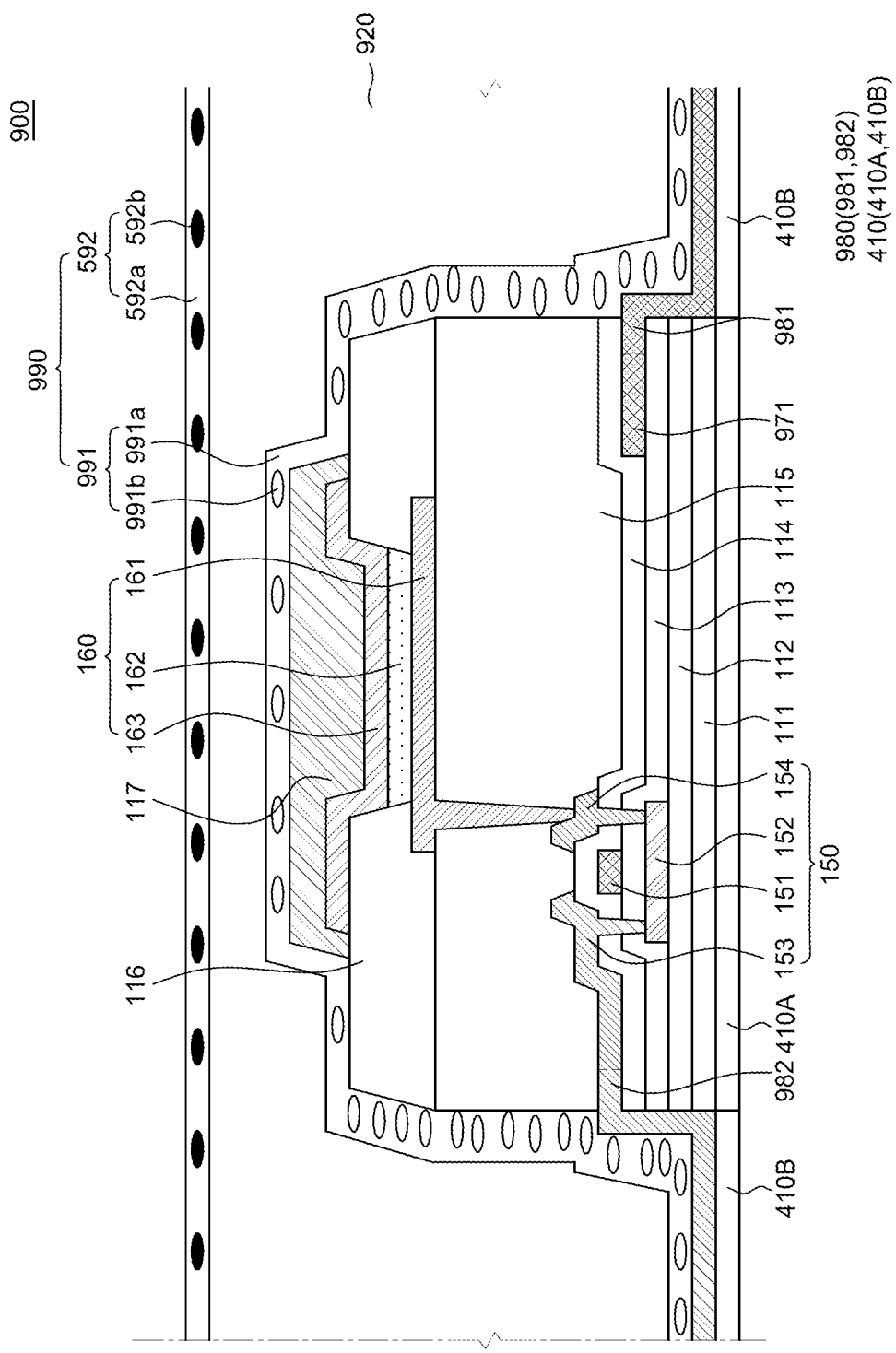
FIG. 10 is a schematic cross-sectional view showing one subpixel of the stretchable display device of FIG. 9.

FIG. 9 is an enlarged plan view of a stretchable display device according to another aspect of the present disclosure and FIG. 10 is a schematic cross-sectional view showing one subpixel of the stretchable display device of FIG. 9. The stretchable display device 900 of FIGS. 9 and 10 is substantially the same as the stretchable display device 700 of FIG. 7 except for having different a connecting line 980 and a phase delay layer 991 of a polarizing layer 990, so repeated description is omitted. Only encapsulation layers 117 of various components disposed on island substrates 111, and connecting lines 980 are shown in FIG. 9 for the convenience of description.

Referring to FIG. 9, the connecting lines 980 of a stretchable display device 900 have a curved shape. The connecting lines 980 electrically connect the pads disposed on adjacent island substrates 111 of a plurality of island substrates 111 and extend not in a straight line, but in a curved shape each between the pads. For example, as shown in FIG. 9, the connecting lines 980 may have a sine waveform. However, the connecting lines 980 are not limited to this shape. For example, the connecting lines 980 may have various shapes, for example, the connecting lines 980 may extend in a zigzag shape or a plurality of diamond-shaped connecting lines extend with the apexes connected.

Referring to FIG. 10, a gate pad 971 is formed on a gate insulating layer 113 and a first connecting line 981 is formed on the gate insulating layer 113 and the second lower patterns 410B of the lower substrate 410.

Referring to FIG. 10, the first connecting line 981 that can function as a gate line is connected with the gate pad 971 and extends from the gate insulating layer 113 to the second lower pattern 410B. Accordingly, the first connecting lines 981 may electrically connect the gate pads 971 respectively formed on adjacent island substrates 111. The first connecting line 981 is in contact with the second lower patterns 410B between the plurality of island substrates 111.

The first connecting line 981 and the gate pad 971 may be made of the same material as a gate electrode 151. Accordingly, the first connecting line 981 and the gate pad 971 may be simultaneously formed in the same process as the gate electrode 151. Accordingly, the first connecting line 981 may be integrally formed by extending from the gate pad 971. However, the present disclosure is not limited thereto, and the gate pad 971 and the first connecting line 981 may be made of different materials, and may be disposed on different layers and electrically connected.

Referring to FIG. 10, a second connecting line 982 that can function as a data line is formed on an inter-layer insulating layer 114. At this time, the source electrode 153 may extend outside an island substrate 111, may function as a data pad, and may be electrically connected with the second connecting line 982. However, the present disclosure is not limited thereto, and a separate data pad may be defined as extending from the source electrode 153 or being electrically connected with the source electrode 153.

The second connecting line 982 is connected with the source electrode 153 and extends from an adjacent island substrate 111 to the second lower pattern 410B. Accordingly, the second connecting line 982 can electrically connect the data pad formed on each of adjacent island substrates 111. The second connecting line 982 is in contact with the second lower pattern 410B between the plurality of island substrates 111.

The second connecting line 982 may be made of the same material as a data pad, that is, the source electrode 153. Accordingly, the second connecting line 982, the source electrode 153, and the drain electrode 154 may be simultaneously formed in the same process. Accordingly, the second connecting line 982 may be integrally formed by extending from the source electrode 153. However, the present disclosure is not limited thereto, and the second connecting line 982 and the source electrode 153 may be made of different materials, and may be disposed on different layers and electrically connected.

Referring to FIGS. 9 and 10, the phase delay layer 991 has a shape corresponding to the plurality of island substrates 111 and the connecting lines 980. That is, the phase delay layer 991 may have a shape overlapping the plurality of island substrates 111 and the connecting lines 980, and accordingly, the polarizing layer 990 may reduce external light reflection by the components disposed on the plurality of island substrates 111 and the connecting lines 980. Referring to FIG. 10, the phase delay layer 991 may be disposed on the connecting lines 980 so as to be in contact with the connecting lines 980, the upper substrate 920 may be disposed on the phase delay layer 991 so as to be in contact with the phase delay layer 991, and the linear polarizing plate 592 may be disposed on the upper substrate 920 so as to be in contact with the upper substrate 920.

In the stretchable display device 900 according to another aspect of the present disclosure, the connecting lines 980 electrically connecting pads formed on the plurality of island substrates 111, such as the first connecting line 981 and the second connecting line 982, may be made of the same material as at least one of a plurality of conductive components disposed on the plurality of island substrates 111. For example, the first connecting line 981 may be made of the same material as the gate electrode 151 and the second connecting line 982 may be made of the same material as the source electrode 153. However, the present disclosure is not limited thereto and the connecting lines 980 may be made of the same material as, other than the gate electrode 151 and the source electrode 153, a drain electrode 154, the electrodes of an organic light emitting element 160 such as an anode 161 and a cathode 163 of the organic light emitting element 160, and various lines included in the stretchable display device 900. Accordingly, the connecting lines 980 can be simultaneously formed in the manufacturing process of conductive components disposed on the plurality of island substrates 111 and made of the same material as the connecting lines 980 in the stretchable display device 900 according to another aspect of the present disclosure. Therefore, there may be no need for a separate manufacturing process for forming the connecting line 980.

When the connecting line 980 is made of metal, light incident into the stretchable display device 900 from the outside of the stretchable display device 900 may be discharged back to the outside of the stretchable display device 900 by the connecting line 980 made of metal. That is, the external light reflection ratio of the stretchable display device 900 may be increased.

Accordingly, in the stretchable display device 900 according to another aspect of the present disclosure, the phase delay layer 991 may be formed to have a shape corresponding to the connecting line 980. Accordingly, light incident into the stretchable display device 900 from the outside of the stretchable display device 900 is not discharged back to the outside of the stretchable display device 900, so the external light reflection of the stretchable display device 900 may be reduced. Further, in the stretchable display device 900 according to another aspect of the present disclosure, the phase delay layer 991 is disposed to be in contact with the connecting line 980 made of metal, the external light reflection of the stretchable display device 900 may be efficiently reduced.

Figure 11:
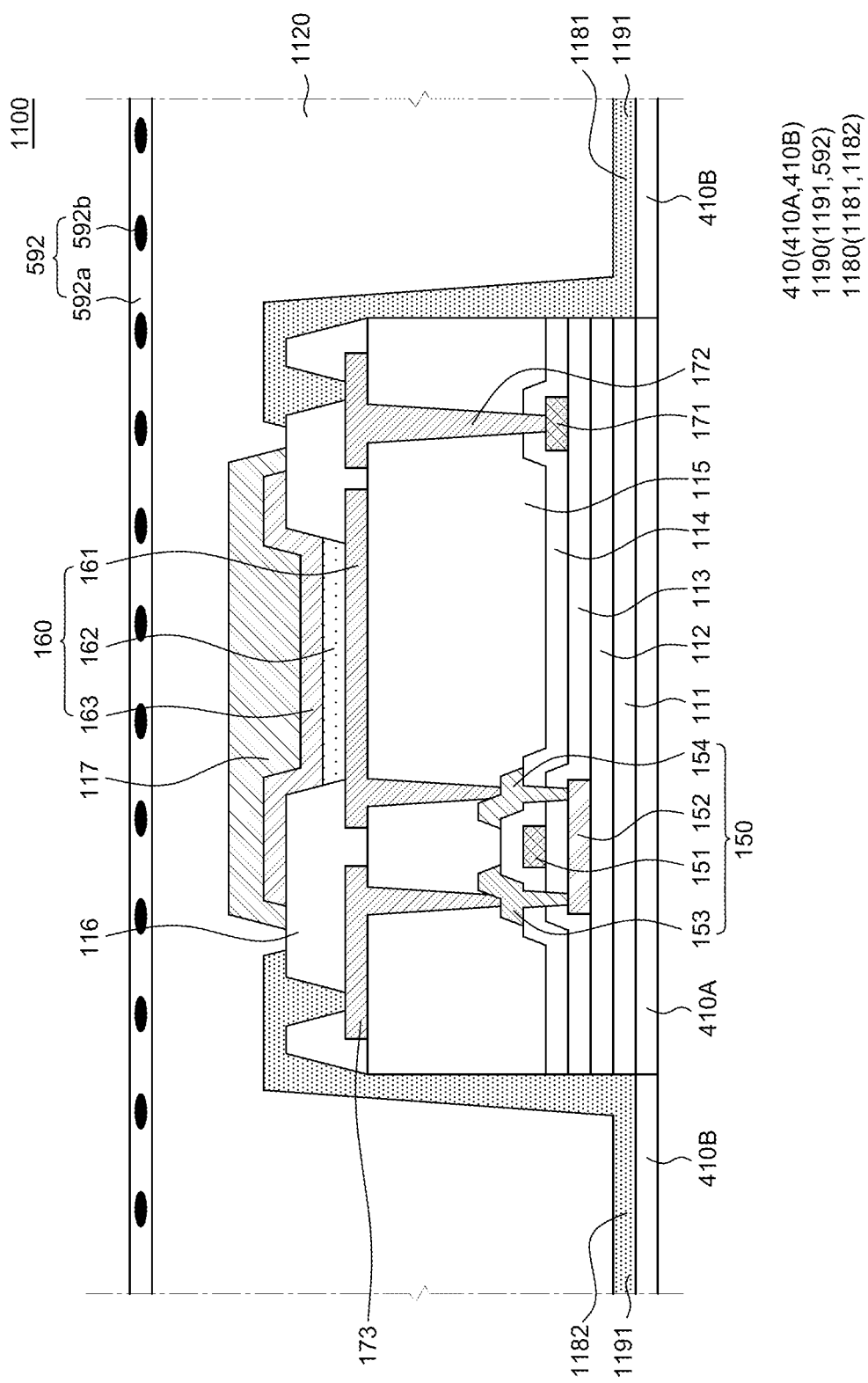
FIG. 11 is a schematic cross-sectional view of one subpixel of a stretchable display device according to another aspect of the present disclosure.

FIG. 11 is a schematic cross-sectional view of one sub-pixel of a stretchable display device according to another aspect of the present disclosure. The stretchable display device 1100 of FIG. 11 is substantially the same as the stretchable display device 700 of FIG. 7 except that a connecting line 1180 and a phase delay layer 1191 are integrally configured and the phase delay layer 1191 is omitted, so repeated description is omitted.

Referring to FIG. 11, a connecting line 1180 and a phase delay layer 1191 are integrally configured, an upper substrate 1120 is disposed to be in contact with the integrally configured connecting line 1190, and the linear polarizing plate 592 is disposed on the top surface of the upper substrate 1120 so as to be in contact with the upper substrate 1120. A base polymer constituting the connecting line 1190 and a first base polymer constituting the phase delay layer 1191 may be made of the same material. Accordingly, in the stretchable display device 1100 according to another aspect of the present disclosure, the connecting line 1190 may be integrally configured with the phase delay layer 1191 by dispersing a reactive mesogen of the phase delay layer 1191 in the base polymer of the connecting line 1190.

In the stretchable display device 1100 according to another aspect of the present disclosure, the connecting line 1190 and the phase delay layer 1191 are integrally configured, whereby the external light reflection of the stretchable display device 1100 may be reduced and the stretchable display device 1100 may be manufactured slightly thin.

Figure 12:
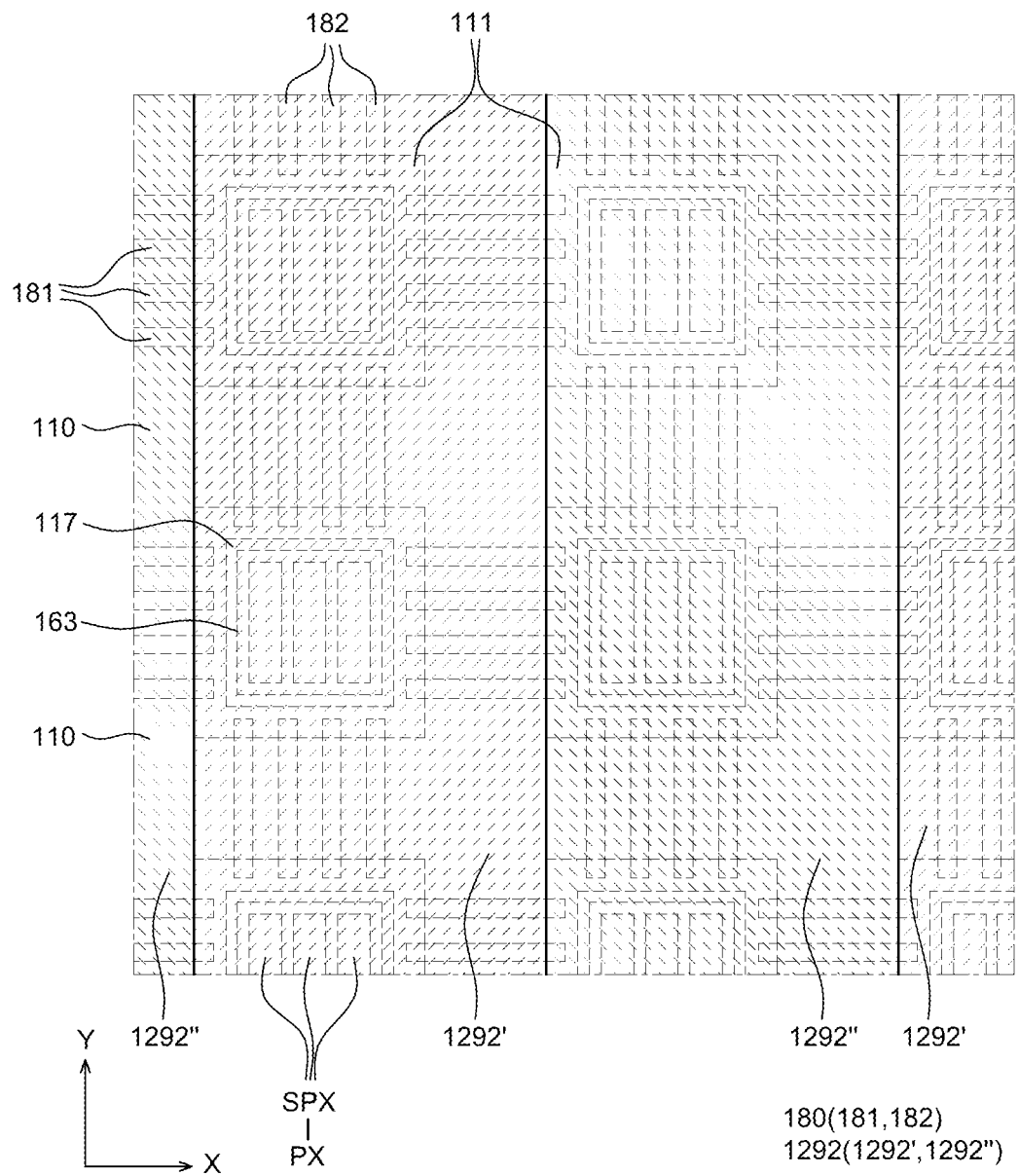
FIG. 12 is a schematic plan view about arrangement of polarizing layers of a stretchable display device according to another aspect of the present disclosure.
Figure 13:
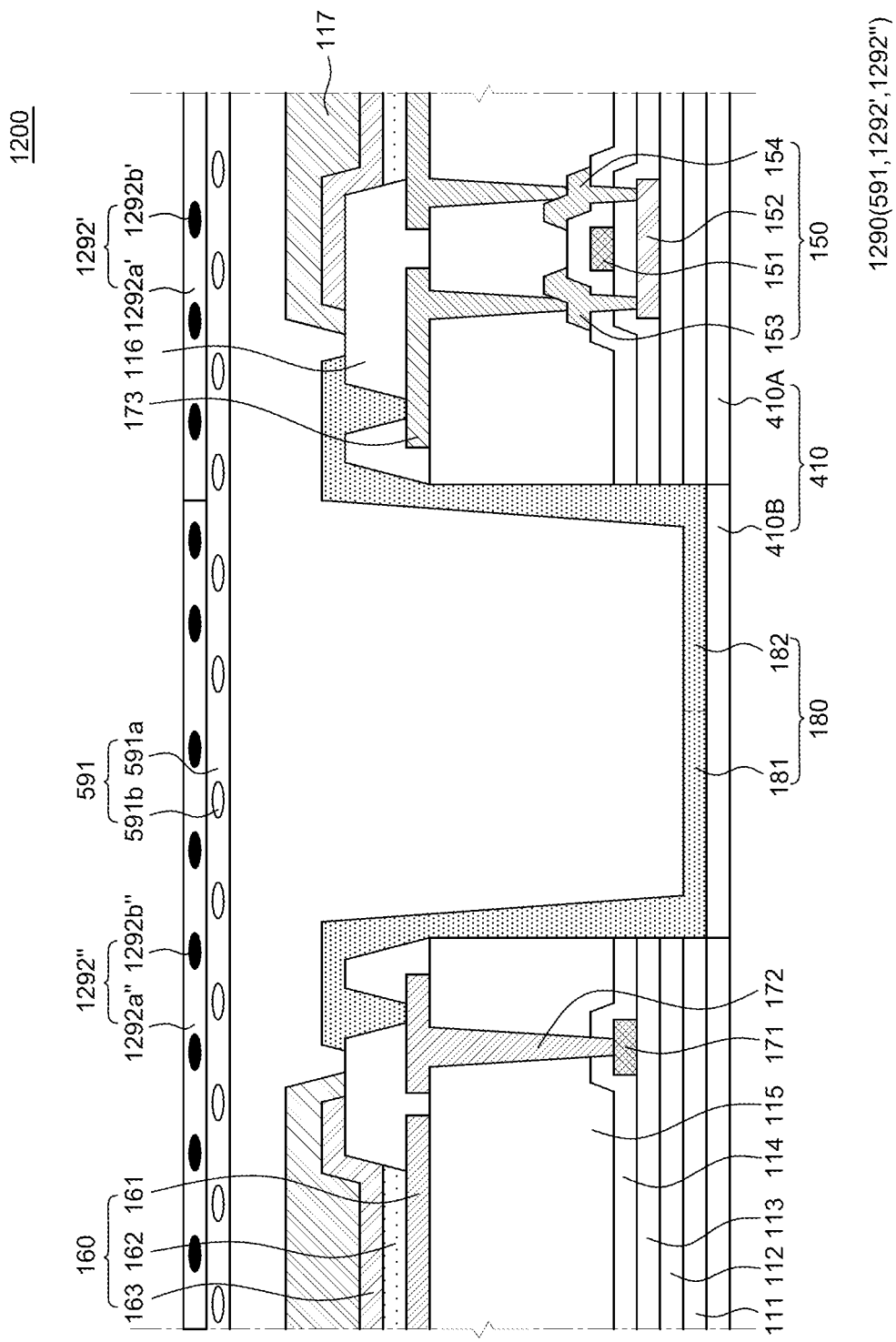
FIG. 13 is a schematic cross-sectional view showing a plurality of subpixels of the stretchable display device of FIG. 12.

FIG. 12 is a schematic plan view about arrangement of polarizing layers of a stretchable display device according to another aspect of the present disclosure. FIG. 13 is a schematic cross-sectional view showing a plurality of sub-pixels of the stretchable display device of FIG. 12. The stretchable display device 1200 of FIGS. 12 and 13 is substantially the same as the stretchable display device 700 of FIG. 7 except for disposition of a linear polarizing plate 1292, so repeated description is omitted.

Referring to FIG. 12, the linear polarizing plate 1292 includes a plurality of first linear polarizing plates 1292' extending in a column direction and a plurality of second linear polarizing plates 1292" disposed between the plurality of first linear polarizing plates 1292'. The plurality of first linear polarizing plates 1292' and the plurality of second linear polarizing plates 1292" may be disposed alternately in the column direction. For example, as shown in FIG. 12, the plurality of first linear polarizing plates 1292' and the plurality of second linear polarizing plates 1292" may extend in a Y-axial direction that is the column direction and may be disposed alternately in an X-axial direction.

The widths of the plurality of first linear polarizing plates 1292' and the plurality of second linear polarizing plates 1292" in a row direction may be the same. In detail, the X-axial widths of the plurality of first linear polarizing plates 1292' and the plurality of second linear polarizing plates 1292" may be the same as the distance from a side of one island substrate 111 to a side of another adjacent island substrate 111. For example, the X-axial widths of the plurality of first linear polarizing plates 1292' and the plurality of second linear polarizing plates 1292" may be disposed from a left edge of one island substrate 111 to a left edge of another adjacent island substrate 111 disposed adjacent to a right side of the corresponding island substrate 111.

The alignment direction of a dye 1292$b'$ in the plurality of first linear polarizing plates 1292' may be different from the alignment direction of a dye 1292$b"$ in the plurality of second linear polarizing plates 1292". In detail, the alignment direction of a dye 1292$b'$ in the plurality of first linear polarizing plates 1292' may be perpendicular to the alignment direction of a dye 1292$b"$ in the plurality of second linear polarizing plates 1292". For example, the alignment direction of a dye 1292$b'$ in the plurality of first linear polarizing plates 1292' may be the X-axial direction and the alignment direction of a dye 1292$b"$ in the plurality of second linear polarizing plates 1292" may be the Y-axial direction perpendicular to the X-axial direction. However, the present disclosure is not limited thereto and, as long as the alignment directions are perpendicular to each other, the alignment direction of a dye 1292$b'$ in the plurality of first linear polarizing plates 1292' and the alignment direction of a dye 1292$b"$ in the plurality of second linear polarizing plates 1292" may be set in various ways.

At this time, the phase delay layer 591 is disposed on the bottom surface of the linear polarizing plate 1292. The phase delay layer 591 may be disposed as a single layer under the plurality of first linear polarizing plates 1292' and the plurality of second linear polarizing plates 1292". As described above, when the alignment direction of a dye 1292$b'$ in the plurality of first linear polarizing plates 1292' may be the X-axial direction and the alignment direction of a dye 1292$b"$ in the plurality of second linear polarizing plates 1292" is the Y-axial direction perpendicular to the X-axial direction, the reactive mesogen 591$b$ of the phase delay layer 591 is aligned in a −45 degrees or +45 degrees direction with respect to the alignment directions of the dyes 1292b' and 1292b" of the plurality of first linear polarizing plates 1292' and the plurality of second linear polarizing plates 1292". Accordingly, the single phase delay layer may circularly polarize external light that has passed through the plurality of first linear polarizing plates 1292' and the plurality of second linear polarizing plates 1292". That is, when the reactive mesogen 591b of the phase delay layer 591 disposed on the bottom surfaces of the plurality of first linear polarizing plates 1292' is disposed in the +45 degree direction with respect to the alignment direction of the dye 1292b' of the plurality of first linear polarizing plates 1292', the reactive mesogen 591b of the phase delay layer 591 disposed on the bottom surfaces of plurality of second linear polarizing plates 1292" is disposed in the −45 degree direction with respect to the alignment direction of the dye 1292b" of the plurality of second linear polarizing plates 1292". Accordingly, the phase delay layer 591 may be configured as a single layer.

The stretchable display device 1200 according to another aspect of the present disclosure may be implemented to stretch not in one direction, but in a plurality of directions. Accordingly, in the stretchable display device 1200 according to another aspect of the present disclosure, the linear polarizing plate 1292 may include the plurality of first linear polarizing plates 1292' and the plurality of second linear polarizing plates 1292" that include dyes aligned in different directions, and the plurality of first linear polarizing plates 1292' and the plurality of second linear polarizing plates 1292" may be alternately disposed. Accordingly, as compared with the case where the linear polarizing plate 1292 includes a dye aligned in a single direction, it is possible to more efficiently reduce external reflection when the stretchable display device is stretched in a plurality of directions. That is, when the stretchable display device 1200 is stretched in a direction similar to the alignment direction of the dye 1292b' of the plurality of first linear polarizing plates 1292', the plurality of first linear polarizing plates 1292' may more efficiently reduce the external light reflection. Further, when the stretchable display device 1200 is stretched in a direction similar to the alignment direction of the dye 1292b" of the plurality of second linear polarizing plates 1292", the plurality of second linear polarizing plates 1292" may more efficiently reduce the external light reflection.

Figure 14:
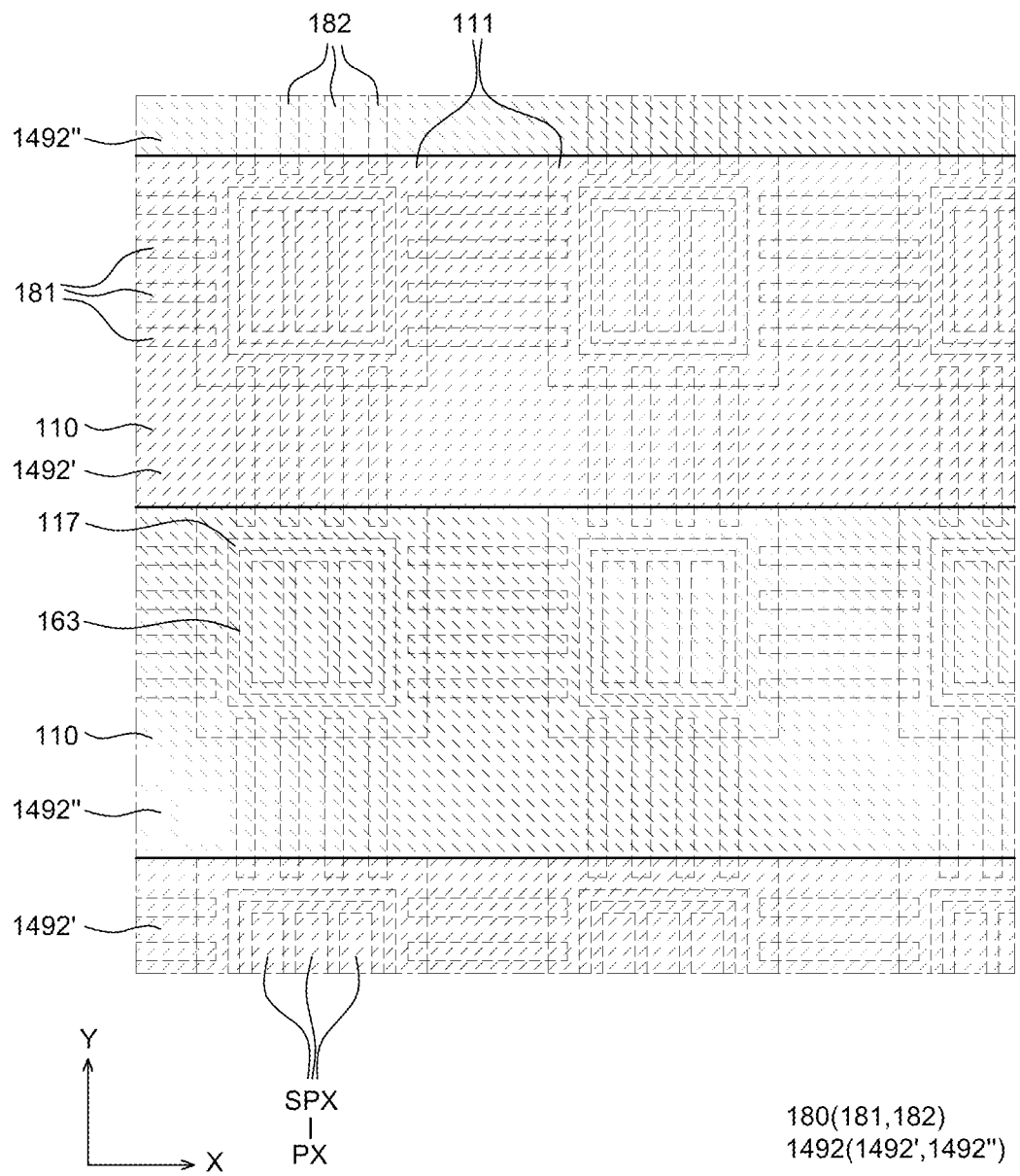
FIG. 14 is a schematic plan view about arrangement of polarizing layers of a stretchable display device according to another aspect of the present disclosure.

FIG. 14 is a schematic plan view about arrangement of polarizing layers of a stretchable display device according to another aspect of the present disclosure. The stretchable display device 1400 of FIG. 14 is substantially the same as the stretchable display device 1200 shown in FIGS. 12 and 13 except for disposition of a linear polarizing plate 1492, so repeated description is omitted.

Referring to FIG. 14, the linear polarizing plate 1492 includes a plurality of first linear polarizing plates 1492' extending in a row direction and a plurality of second linear polarizing plates 1492" disposed between the plurality of first linear polarizing plates 1492'. The plurality of first linear polarizing plates 1492' and the plurality of second linear polarizing plates 1492" may be disposed alternately in the row direction. For example, as shown in FIG. 12, the plurality of first linear polarizing plates 1492' and the plurality of second linear polarizing plates 1492" may extend in an X-axial direction that is the row direction and may be disposed alternately in a Y-axial direction.

The widths of the plurality of first linear polarizing plates 1492' and the plurality of second linear polarizing plates 1492" in the column direction may be the same. In detail, the Y-axial widths of the plurality of first linear polarizing plates 1492' and the plurality of second linear polarizing plates 1492" may be the same as the distance from a side of one island substrate 111 to a side of another adjacent island substrate 111. For example, the Y-axial widths of the plurality of first linear polarizing plates 1492' and the plurality of second linear polarizing plates 1492" may be disposed from an upper edge of one island substrate 111 to an upper edge of another adjacent island substrate 111 disposed adjacent to a left side of the corresponding island substrate 111.

The alignment direction of a dye in the plurality of first linear polarizing plates 1492' may be different from the alignment direction of a dye in the plurality of second linear polarizing plates 1492". In detail, the alignment direction of the dye in the plurality of first linear polarizing plates 1492' may be perpendicular to the alignment direction of the dye in the plurality of second linear polarizing plates 1492". For example, the alignment direction of the dye in the plurality of first linear polarizing plates 1492' may be the X-axial direction and the alignment direction of the dye in the plurality of second linear polarizing plates 1492" may be the Y-axial direction perpendicular to the X-axial direction. However, the present disclosure is not limited thereto and, as long as the alignment directions are perpendicular to each other, the alignment direction of the dye in the plurality of first linear polarizing plates 1492' and the alignment direction of the dye in the plurality of second linear polarizing plates 1492" may be set in various ways.

At this time, the phase delay layer 591 is disposed on the bottom surface of the linear polarizing plate 1492. The phase delay layer 591 may be disposed as a single layer under the plurality of first linear polarizing plates 1492' and the plurality of second linear polarizing plates 1492". As described above, when the alignment direction of the dye in the plurality of first linear polarizing plates 1492' may be the X-axial direction and the alignment direction of the dye in the plurality of second linear polarizing plates 1492" is the Y-axial direction perpendicular to the X-axial direction, the reactive mesogen of the phase delay layer 591 has only to be aligned in a −45 degrees or +45 degrees direction with respect to the alignment directions of the dyes of the plurality of first linear polarizing plates 1492' and the plurality of second linear polarizing plates 1492". Accordingly, the single phase delay layer 591 may circularly polarize external light that has passed through the plurality of first linear polarizing plates 1492' and the plurality of second linear polarizing plates 1492", respectively. That is, when the reactive mesogen of the phase delay layer 591 disposed on the bottom surfaces of the plurality of first linear polarizing plates 1492' is disposed in the +45 degree direction with respect to the alignment direction of the dye of the plurality of first linear polarizing plates 1492', the reactive mesogen of the phase delay layer 591 disposed on the bottom surfaces of plurality of second linear polarizing plates 1492" is disposed in the −45 degree direction with respect to the alignment direction of the dye of the plurality of second linear polarizing plates 1492". Accordingly, the phase delay layer may be configured as a single layer.

The stretchable display device 1400 according to another aspect of the present disclosure may be implemented to stretch not in one direction, but in a plurality of directions. Accordingly, in the stretchable display device 1400 according to another aspect of the present disclosure, the linear polarizing plate 1492 may include the plurality of first linear polarizing plates 1492' and the plurality of second linear polarizing plates 1492" that include dyes aligned in different directions, and the plurality of first linear polarizing plates 1492' and the plurality of second linear polarizing plates 1492" may be alternately disposed. Accordingly, as compared with the case where the linear polarizing plate 1492 includes a dye aligned in a single direction, it is possible to more efficiently reduce external reflection when the stretchable display device is stretched in a plurality of direction. That is, when the stretchable display device 1400 is stretched in a direction similar to the alignment direction of the dye of the plurality of first linear polarizing plates 1492', the plurality of first linear polarizing plates 1492' may more efficiently reduce the external light reflection. Further, when the stretchable display device 1400 is stretched in a direction similar to the alignment direction of the dye of the plurality of second linear polarizing plates 1492", the plurality of second linear polarizing plates 1492" may more efficiently reduce the external light reflection.

Figure 15:
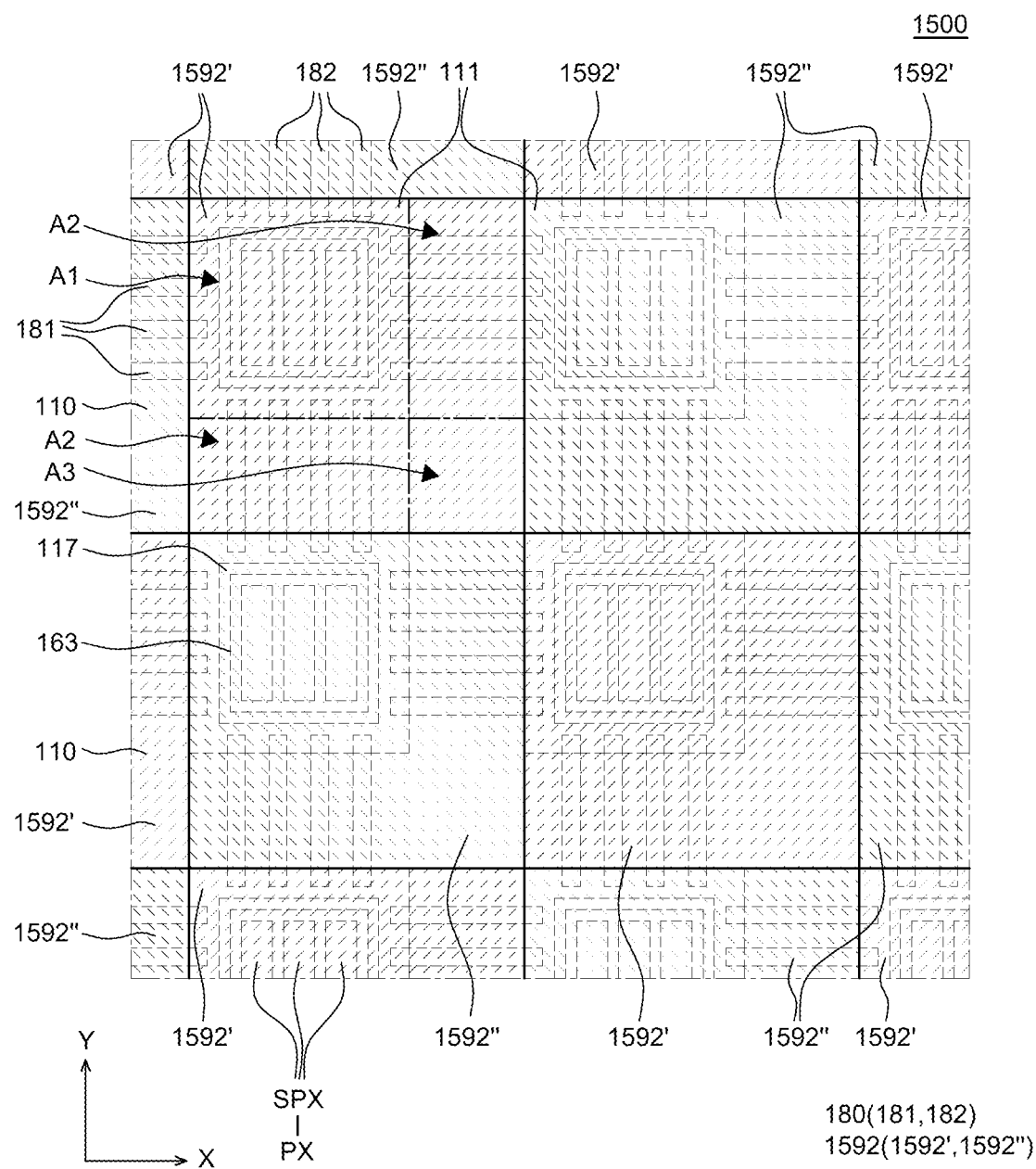
FIG. 15 is a schematic plan view about arrangement of polarizing layers of a stretchable display device according to another aspect of the present disclosure.

FIG. 15 is a schematic plan view about arrangement of polarizing layers of a stretchable display device according to another aspect of the present disclosure. The stretchable display device of FIG. 15 is substantially the same as the stretchable display device 1200 shown in FIGS. 12 and 13 except for disposition of a linear polarizing plate 1592, so repeated description is omitted.

Referring to FIG. 15, the linear polarizing plate 1592 includes a plurality of linear polarizing patterns 1592' and 1592" disposed in a matrix shape. Dyes are respectively dispersed in the plurality of linear polarizing patterns 1592' and 1592" and the alignment direction of the dyes dispersed in the plurality of linear polarizing patterns 1592' and 1592" may be aligned differently from the alignment direction of the dyes dispersed in linear polarizing patterns 1592' and 1592" that are adjacent in a row direction and a column direction.

In detail, the plurality of linear polarizing patterns 1592' and 1592" includes a plurality of first linear polarizing patterns 1592' and a plurality of second linear polarizing patterns 1592". A second linear polarizing pattern 1592" is disposed at positions in the row direction and the column direction adjacent to each of the plurality of first linear polarizing patterns 1592'. Accordingly, for example, the plurality of first linear polarizing patterns 1592' may be disposed in a mosaic pattern shape and the plurality of second linear polarizing patterns 1592" may also be disposed in a mosaic pattern shape.

At this time, the alignment direction of the dye dispersed in the plurality of first linear polarizing patterns 1592' and the alignment direction of the dye dispersed in the plurality of second linear polarizing patterns 1592" may be different from each other. In detail, the alignment direction of the dye dispersed in the plurality of first linear polarizing patterns 1592' and the alignment direction of the dye dispersed in the plurality of second linear polarizing patterns 1592" may be perpendicular to each other. For example, when the alignment direction of the dye dispersed in the plurality of first linear polarizing patterns 1592' is the row direction, that is, a Y-axial direction, the alignment direction of the dye dispersed in the plurality of second linear polarizing patterns 1592" may be the column direction, that is, an X-axial direction. That is, the plurality of first linear polarizing patterns 1592' in which the dye is aligned in the row direction and the plurality of second linear polarizing patterns 1592" in which the dye is aligned in the column direction may be alternately disposed in the row direction and the column direction.

Referring to FIG. 15, the lower substrate 110 may include a plurality of first areas A1 in which a plurality of island substrates 111 is disposed, a plurality of second areas A2 in which connecting lines are disposed, and a plurality of third areas A3 making a rectangle with one of the plurality of first areas A1 and two of the plurality of second areas A2.

The plurality of first areas A1, which is an area in which the plurality of island substrates 111 is disposed, may be defined as an area overlapping the plurality of island substrates 111. The plurality of first areas A1 is spaced apart from each other and defined on the lower substrate 110. For example, the plurality of first areas A1, as shown in FIG. 15, may be disposed in a matrix shape on the lower substrate 110, but is not limited thereto.

The plurality of second areas A2 is disposed adjacent to the plurality of first areas A1. In detail, the plurality of second areas A2 is defined between two adjacent first areas A1. Accordingly, as shown in FIG. 15, the plurality of second areas A2 is defined at the upper side, the lower side, the left side, and the right side of the plurality of first areas A1. The plurality of second areas A2 is areas in which a first connecting line and a second connecting line of the connecting line are disposed. That is, a first connecting line and a second connecting line connecting pads of a plurality of adjacent island substrates 111 are disposed in the plurality of second areas A2. The plurality of second areas A2 is spaced apart from each other and defined on the lower substrate 110. For example, the plurality of second areas A2, as shown in FIG. 15, may be disposed in a matrix shape on the lower substrate 110, but is not limited thereto. Meanwhile, the second area A2 may be referred to as a line area in this specification.

Referring to FIG. 15, the plurality of third areas A3 making a rectangle with one of the plurality of first areas A1 and two of the plurality of second areas A2 is defined. A second area A2 is defined at the upper side, the lower side, the right side, and the left side of each of the plurality of third areas A3 and the plurality of first areas A1 is defined to be adjacent in diagonal directions.

Referring to FIG. 15, the plurality of linear polarizing patterns 1592' and 1592" each may be disposed to overlap one of the plurality of first areas A1, two of the plurality of second areas A2, and one of the plurality of third areas A3. That is, a linear polarizing pattern may have a rectangular shape by being disposed to overlap all of the first area A1, the second area A2, and the third area A3.

The stretchable display device 1500 according to another aspect of the present disclosure may be implemented to stretch not in one direction, but in a plurality of directions. Accordingly, in the stretchable display device 1500 according to another aspect of the present disclosure, the linear polarizing plate 1592 may include the plurality of first linear polarizing patterns 1592' and the plurality of second linear polarizing patterns 1592" that include dyes aligned in different directions, and the plurality of first linear polarizing patterns 1592' and the plurality of second linear polarizing patterns 1592" may be disposed in a matrix shape. At this time, the plurality of first linear polarizing patterns 1592' and the plurality of second linear polarizing patterns 1592" are disposed alternately in the row direction and the column direction, so it is possible to more efficiently reduce external light reflection when the stretchable display device is stretched in a plurality of directions, as compared with the case where the linear polarizing plate 1592 includes a dye aligned in a single direction. That is, when the stretchable display device 1500 is stretched in a direction similar to the alignment direction of the dye of the plurality of first linear polarizing patterns 1592', the plurality of first linear polarizing patterns 1592' may more efficiently reduce external light reflection. Further, when the stretchable display device 1500 is stretched in a direction similar to the alignment direction of the dye of the plurality of second linear polarizing patterns 1592", the plurality of second linear polarizing patterns 1592" may more efficiently reduce the external light reflection.

In the stretchable display device 1500 according to another aspect of the present disclosure, the plurality of linear polarizing patterns 1592' and 1592" is disposed to each overlap one of the plurality of first areas A1, two of the plurality of second areas A2, and one of the plurality of third areas A3. Accordingly, light incident into the stretchable display device 1500 from the outside of the stretchable display device 1500 is not discharged back to the outside the stretchable display device 1500, thereby being able to reduce the external light reflection of the stretchable display device 1500.

The exemplary aspects of the present disclosure can also be described as follows:

According to an aspect of the present disclosure, a stretchable display device comprises a plurality of island substrates in which a plurality of pixels is defined and that is spaced apart from each other; a lower substrate disposed under the plurality of island substrates; a connecting line electrically connecting pads disposed adjacent island substrates of the plurality of island substrates; and a polarizing layer disposed on the lower substrate and the plurality of island substrates, wherein the polarizing layer includes a phase delay layer having a reactive mesogen dispersed in a first base polymer, and a linear polarizing plate disposed on the phase delay layer and having a dye dispersed in a second base polymer.

The dye may be aligned in a first direction in the second base polymer, and the reactive mesogen may be aligned in a −45 degrees or +45 degrees direction with respect to the first direction in the first base polymer.

The stretchable display device may be implemented to be stretched in the first direction.

The connecting line may include a base polymer and conductive particles dispersed in the base polymer.

The stretchable display device may further comprise an upper adhesive layer disposed on a bottom surface of the polarizing layer; an upper substrate attached to a bottom surface of the upper adhesive layer; and a lower adhesive layer attaching the upper substrate to the lower substrate, the island substrates, and the connecting line.

The stretchable display device may further comprise an upper substrate disposed to be in contact with the lower substrate, the island substrates, and the connecting line, wherein the polarizing layer may be disposed to be in contact with a top surface of the upper substrate, and the first base polymer and the second base polymer may be made of the same material as the upper substrate.

The linear polarizing plate may include a plurality of first linear polarizing plates extending in a row direction or a column direction and a plurality of second linear polarizing plates disposed between the plurality of first linear polarizing plates, and an alignment direction of the dye in the plurality of first linear polarizing plates and an alignment direction of the dye in the plurality of second linear polarizing plates may be perpendicular.

The linear polarizing plate may include a plurality of linear polarizing patterns disposed in a matrix shape, and an alignment direction of the dye dispersed in the plurality of linear polarizing patterns may be perpendicular to an alignment direction of the dye dispersed in linear polarizing patterns adjacent to each other in a row direction and a column direction.

The lower substrate may include a plurality of first areas in which the plurality of island substrates is disposed, a plurality of second areas in which the connecting lines are disposed, and a plurality of third areas making a rectangle with one of the plurality of first areas and two of the plurality of second areas, and the plurality of linear polarizing patterns each may overlap one of the plurality of first areas, two of the plurality of second areas, and one of the plurality of third areas.

The stretchable display device may further comprise an upper substrate disposed to be in contact with the lower substrate, the island substrates, and the connecting line, wherein the connecting line may be integrally configured with the phase delay layer by dispersing the reactive mesogen in the base polymer of the connecting line, and the linear polarizing plate may be disposed to be in contact with a top surface of the upper substrate.

The phase delay layer may be disposed to be in contact with the lower substrate, the island substrates, and the connecting line.

The stretchable display device may further comprise a plurality of conductive components disposed on each of the plurality of island substrates; and an upper substrate disposed to be in contact with a bottom surface of the linear polarizing plate, wherein the connecting line may be made of the same material as at least one of the plurality of conductive components, and has a curved shape, and the phase delay layer may be disposed to be in contact with a bottom surface of the upper substrate and may have a shape corresponding to the plurality of island substrates and the connecting line.

The first base polymer and the second base polymer may be made of the same material as the lower substrate.

According to another aspect of the present disclosure, a stretchable display device may comprise a lower substrate; a plurality of island substrates disposed on the lower substrate and spaced apart from each other; a plurality of display elements disposed on the plurality of island substrates; and a polarizing layer disposed on the lower substrate and the plurality of display elements and having a structure in which a phase delay layer and a linear polarizing plate are stacked, wherein base polymers constituting the phase delay layer and the linear polarizing plate may be made of the same material as the lower substrate.

The phase delay layer may include a reactive mesogen dispersed in a first base polymer, the linear polarizing plate may include a dye dispersed in a second base polymer, and the reactive mesogen may be aligned in a −45 degrees or +45 degrees direction with respect to an alignment direction of the dye.

The stretchable display device may further comprise an upper substrate disposed under the linear polarizing plate, wherein the upper substrate may be disposed between the plurality of connecting lines and the phase delay layer or between the phase delay layer and the linear polarizing plate.

The first base polymer and the second base polymer may be made of the same material as the upper substrate.

The linear polarizing plate may include a plurality of first linear polarizing plates and a plurality of second linear polarizing plates that include dyes aligned perpendicular to each other, wherein the plurality of first linear polarizing plates and the plurality of second linear polarizing plates may be disposed alternately in a row direction or a column direction.

The linear polarizing plate may include a plurality of first linear polarizing patterns and a plurality of second linear polarizing patterns that include dyes aligned perpendicular to each other, wherein the plurality of first linear polarizing patterns and the plurality of second linear polarizing patterns may be disposed alternately in a row direction and a column direction.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A stretchable display device comprising:
a lower substrate;
a plurality of island substrates disposed on the lower substrate and spaced apart from each other;
a plurality of display elements disposed on the plurality of island substrates;
a plurality of connecting lines disposed between each of the plurality of island substrates;
an upper substrate disposed on the lower substrate, the plurality of display elements and the plurality of connecting lines; and
a polarizing layer disposed on the upper substrate and including a phase delay layer on the upper substrate and a linear polarizing plate on the phase delay layer,
wherein the phase delay layer includes a first base polymer,
wherein the linear polarizing plate includes a second base polymer, and
wherein the first and second base polymers include a same material as the upper substrate.

2. The stretchable display device of claim 1, wherein the phase delay layer includes a reactive mesogen dispersed in the first base polymer, and the linear polarizing plate includes a dye dispersed in the second base polymer, and the reactive mesogen is aligned in −45 degrees or +45 degree direction with respect to an alignment direction of the dye.

3. The stretchable display device of claim 1, further comprising a first adhesive layer disposed between the upper substrate and the plurality of island substrates.

4. The stretchable display device of claim 3, wherein the upper substrate is disposed between the first adhesive layer and the polarizing layer.

5. The stretchable display device of claim 1, wherein the linear polarizing plate includes a plurality of first linear polarizing plates and a plurality of second linear polarizing plates that include dyes aligned perpendicular to each other, and
wherein the plurality of first linear polarizing plates and the plurality of second linear polarizing plates are disposed alternately in a row direction or a column direction.

6. The stretchable display device of claim 1, wherein the linear polarizing plate includes a plurality of first linear polarizing patterns and a plurality of second linear polarizing patterns that include dyes aligned perpendicular to each other, and
wherein the plurality of first linear polarizing patterns and the plurality of second linear polarizing patterns are disposed alternately in a row direction and a column direction.

7. The stretchable display device of claim 3, further comprising a second adhesive layer disposed between the polarizing layer and the upper substrate.

8. A stretchable display device comprising:
a lower substrate;
a plurality of island substrates disposed on the lower substrate and spaced apart from each other;
a plurality of display elements disposed on the plurality of island substrates;
a plurality of connecting lines disposed between each of the plurality of island substrates; and
a polarizing layer disposed on the lower substrate, the plurality of display elements and the plurality of connecting lines, and including a structure in which a phase delay layer and a linear polarizing plate are stacked,
wherein the linear polarizing plate includes a plurality of first linear polarizing plates and a plurality of second linear polarizing plates that include dyes aligned perpendicular to each other, and
wherein the plurality of first linear polarizing plates and the plurality of second linear polarizing plates are disposed alternately in a row direction or a column direction.

9. The stretchable display device of claim 8, wherein the phase delay layer includes a first base polymer and the linear polarizing plate includes a second base polymer.

10. The stretchable display device of claim 9, wherein the first base polymer and the second base polymer include a same material as the lower substrate.

11. The stretchable display device of claim 8, further comprising an upper substrate disposed on the lower substrate, the plurality of display elements and the plurality of connecting lines,
wherein the upper substrate is disposed between the polarizing layer and the plurality of island substrates.

12. A stretchable display device comprising:
a lower substrate;
a plurality of island substrates disposed on the lower substrate and spaced apart from each other;
a plurality of display elements disposed on the plurality of island substrates;
a plurality of connecting lines disposed between each of the plurality of island substrates; and
a polarizing layer disposed on the lower substrate, the plurality of display elements and the plurality of connecting lines, and including a structure in which a phase delay layer and a linear polarizing plate are stacked,
wherein the linear polarizing plate includes a plurality of first linear polarizing patterns and a plurality of second linear polarizing patterns that include dyes aligned perpendicular to each other, and
wherein the plurality of first linear polarizing patterns and the plurality of second linear polarizing patterns are disposed alternately in a row direction and a column direction.

* * * * *